US010854531B2

(12) United States Patent
Chew

(10) Patent No.: US 10,854,531 B2
(45) Date of Patent: Dec. 1, 2020

(54) SEMICONDUCTOR PACKAGING METHOD, SEMICONDUCTOR PACKAGE AND STACKED SEMICONDUCTOR PACKAGES

(71) Applicant: PEP INNOVATION PTE LTD., Singapore (SG)

(72) Inventor: Yi Xin Chew, Singapore (SG)

(73) Assignee: PEP INNOVATION PTE LTD., Singapore (SG)

( * ) Notice: Subject to any disclaimer, the term of this patent is extended or adjusted under 35 U.S.C. 154(b) by 0 days.

(21) Appl. No.: 15/739,939

(22) PCT Filed: Jun. 24, 2016

(86) PCT No.: PCT/SG2016/050290
§ 371 (c)(1),
(2) Date: Dec. 26, 2017

(87) PCT Pub. No.: WO2016/209172
PCT Pub. Date: Dec. 29, 2016

(65) Prior Publication Data
US 2018/0190513 A1    Jul. 5, 2018

(30) Foreign Application Priority Data

Jun. 26, 2015 (SG) ............................ 10201505116W
Nov. 6, 2015 (SG) ............................ 10201509222T
(Continued)

(51) Int. Cl.
*H01L 23/367* (2006.01)
*H01L 23/433* (2006.01)
(Continued)

(52) U.S. Cl.
CPC ...... *H01L 23/3677* (2013.01); *H01L 21/4846* (2013.01); *H01L 21/561* (2013.01);
(Continued)

(58) Field of Classification Search
CPC ............ H01L 23/3677; H01L 23/5226; H01L 23/5389; H01L 23/552; H01L 23/562; H01L 24/20; H01L 24/97
See application file for complete search history.

(56) References Cited

U.S. PATENT DOCUMENTS 6,093,584 A     7/2000 Fjelstad
2003/0146508 A1* 8/2003 Chen ...................... H01L 23/13
                                                    257/738
(Continued)

FOREIGN PATENT DOCUMENTS

CN        102810520 A     12/2012

OTHER PUBLICATIONS

TW Search Report for Application No. 105119996, dated Nov. 24, 2019.
China Office Action No. 201610475027.5, dated Jul. 17, 2020.

*Primary Examiner* — Feifei Yeung Lopez
(74) *Attorney, Agent, or Firm* — Nixon Peabody LLP; Thomas P. Pavelko

(57) ABSTRACT

A semiconductor packaging method, a semiconductor package and stacked semiconductor packages are provided. The method includes providing a carrier (10) having a plurality of semiconductor chip receiving areas (12) and attaching a plurality of first semiconductor chips (14) to the semiconductor chip receiving areas (12). The first semiconductor chips (14) are encapsulated with a first encapsulant (20) and a plurality of electrical connections (24) is formed to the first semiconductor chips (14). At least a portion of the carrier (10) is removed to provide a heat release area (38).

10 Claims, 23 Drawing Sheets

(30) Foreign Application Priority Data

| Nov. 23, 2015 | (SG) | 10201509616R |
|---|---|---|
| Dec. 14, 2015 | (SG) | 10201510240R |
| Dec. 14, 2015 | (SG) | 10201510242X |
| Dec. 15, 2015 | (SG) | 10201510291X |
| Dec. 15, 2015 | (SG) | 10201510293Y |
| Dec. 15, 2015 | (SG) | 10201510295R |

(51) Int. Cl.

| H01L 23/552 | (2006.01) |
|---|---|
| H01L 21/56 | (2006.01) |
| H01L 23/00 | (2006.01) |
| H01L 23/538 | (2006.01) |
| H01L 21/48 | (2006.01) |
| H01L 23/498 | (2006.01) |
| H01L 21/768 | (2006.01) |
| H01L 23/522 | (2006.01) |
| H01L 25/065 | (2006.01) |
| H01L 23/31 | (2006.01) |
| H01L 25/10 | (2006.01) |

(52) U.S. Cl.
CPC ...... *H01L 21/568* (2013.01); *H01L 21/76802* (2013.01); *H01L 23/4334* (2013.01); *H01L 23/49827* (2013.01); *H01L 23/5226* (2013.01); *H01L 23/5389* (2013.01); *H01L 23/552* (2013.01); *H01L 23/562* (2013.01); *H01L 24/11* (2013.01); *H01L 24/17* (2013.01); *H01L 24/19* (2013.01); *H01L 24/20* (2013.01); *H01L 24/97* (2013.01); *H01L 25/0657* (2013.01); *H01L 23/3121* (2013.01); *H01L 23/3128* (2013.01); *H01L 25/105* (2013.01); *H01L 2224/04105* (2013.01); *H01L 2224/12105* (2013.01); *H01L 2224/16227* (2013.01); *H01L 2224/16235* (2013.01); *H01L 2224/19* (2013.01); *H01L 2224/24195* (2013.01); *H01L 2224/24247* (2013.01); *H01L 2224/2518* (2013.01); *H01L 2224/32225* (2013.01); *H01L 2224/32245* (2013.01); *H01L 2224/48247* (2013.01); *H01L 2224/73204* (2013.01); *H01L 2224/73265* (2013.01); *H01L 2224/73267* (2013.01); *H01L 2224/92144* (2013.01); *H01L 2224/92244* (2013.01); *H01L 2224/96* (2013.01); *H01L 2224/97* (2013.01); *H01L 2225/1035* (2013.01); *H01L 2225/1058* (2013.01); *H01L 2225/1094* (2013.01); *H01L 2924/15311* (2013.01); *H01L 2924/18162* (2013.01); *H01L 2924/19105* (2013.01); *H01L 2924/3025* (2013.01); *H01L 2924/3511* (2013.01)

(56) References Cited

U.S. PATENT DOCUMENTS

| 2003/0189246 | A1* | 10/2003 | Iwaki | H01L 21/481 257/706 |
|---|---|---|---|---|
| 2007/0085205 | A1* | 4/2007 | Chen | H01L 24/82 257/737 |
| 2008/0136004 | A1* | 6/2008 | Yang | H01L 24/96 257/686 |
| 2008/0258293 | A1 | 10/2008 | Yang et al. | |
| 2011/0037165 | A1 | 2/2011 | Oh et al. | |
| 2011/0198752 | A1 | 8/2011 | Nondhasitthichai et al. | |
| 2014/0091445 | A1* | 4/2014 | Teh | H01L 25/18 257/675 |
| 2014/0264817 | A1 | 9/2014 | Lee et al. | |
| 2015/0259194 | A1* | 9/2015 | Lin | B81B 7/007 257/773 |
| 2015/0333232 | A1 | 11/2015 | Preu et al. | |
| 2016/0211221 | A1* | 7/2016 | Kim | H01L 23/552 |

* cited by examiner

SEMICONDUCTOR PACKAGING METHOD, SEMICONDUCTOR PACKAGE AND STACKED SEMICONDUCTOR PACKAGES

CROSS-REFERENCE TO RELATED APPLICATIONS

This application is a 35 U.S.C. 371 National Phase of International Application serial number PCT/SG2016/050290, filed Jun. 24, 2016 and claims priority of the following patent applications: SG 10201505116W, filed Jun. 26, 2015; SG 10201509222T, filed Nov. 6, 2015; SG 10201509616R, filed Nov. 23, 2015; SG 10201510240R, filed Dec. 14, 2015: SG 10201510242X, filed Dec. 14, 2015; SG 10201510291X filed Dec. 15, 2015: SG 10201510293Y, filed Dec. 15, 2015; and SG 10201510295R, filed Dec. 15, 2015; the entire disclosures of which are herein incorporated by reference in their entireties.

FIELD OF THE INVENTION

The present invention relates to semiconductor packaging and more particularly to a semiconductor packaging method, a semiconductor package and stacked semiconductor packages.

BACKGROUND OF THE INVENTION

Manufacturability, thermal considerations and package dimensions are important considerations in semiconductor packaging as these affect packaging cost, package applications and/or reliability. It would therefore be desirable to have a semiconductor packaging method and a semiconductor package that meets one or more of these needs.

SUMMARY OF THE INVENTION

Accordingly, in a first aspect, the present invention provides a semiconductor packaging method. The semiconductor packaging method includes providing a carrier having a plurality of semiconductor chip receiving areas and attaching a plurality of first semiconductor chips to the semiconductor chip receiving areas. The first semiconductor chips are encapsulated with a first encapsulant and a plurality of electrical connections is formed to the first semiconductor chips. At least a portion of the carrier is removed to provide a heat release area.

In a second aspect, the present invention provides a semiconductor package including a first semiconductor chip, a first encapsulant encapsulating the first semiconductor chip, and a plurality of electrical connections to the first semiconductor chip. A heat release area is arranged to release heat generated by the first semiconductor chip. The heat release area includes one of: a surface of a die pad to which the first semiconductor chip is attached; a non-active surface of the first semiconductor chip; a surface of a conductive layer to which a die pad is attached, the first semiconductor chip being attached to the die pad; a surface of a conductive layer to which the first semiconductor chip is attached; a surface area of a heat sink attached to a conductive layer, the first semiconductor chip being attached to the conductive layer; a surface area of an array of heat sinks attached to a conductive layer, the first semiconductor chip being attached to the conductive layer; a surface area of a plurality of fins attached to a conductive layer, the first semiconductor chip being attached to the conductive layer; and a surface area of a heat sink attached to a conductive layer to which a die pad is attached, the first semiconductor chip being attached to the die pad.

In a third aspect, the present invention provides a stacked semiconductor package. The stacked semiconductor package includes a first semiconductor package in accordance with the second aspect and further including a plurality of vias extending though the first encapsulant to the first semiconductor chip, a plurality of first traces on a surface of the first encapsulant, the first traces being electrically connected by the vias to the first semiconductor chip, a second encapsulant encapsulating the first traces and a plurality of openings extending through the second encapsulant to expose a surface of the first traces. A plurality of solder bumps is attached to the exposed surface of the first traces. The stacked semiconductor package also includes a second semiconductor package in accordance with the second aspect and further including at least one of a plurality of pads, a plurality of connectors, a plurality of passive components, at least one strengthening element, an electromagnetic shielding structure and an inductor coil encapsulated by the first encapsulant. The solder bumps are electrically coupled to the pads of the second semiconductor package.

In a fourth aspect, the present invention provides a stacked semiconductor package. The stacked semiconductor package includes first and second semiconductor packages in accordance with the second aspect and further including at least one of a plurality of pads, a plurality of connectors, a plurality of passive components, at least one strengthening element, an electromagnetic shielding structure and an inductor coil encapsulated by the first encapsulant. A solder material electrically couples a first die pad of the first semiconductor package to a second die pad of the second semiconductor package and a plurality of first pads of the first semiconductor package to a plurality of second pads of the second semiconductor package.

In a fifth aspect, the present invention provides a stacked semiconductor package. The stacked semiconductor package includes a first semiconductor package in accordance with the second aspect and further including a plurality of vias extending though the first encapsulant to the first semiconductor chip, a plurality of first traces on a surface of the first encapsulant, the first traces being electrically connected by the vias to the first semiconductor chip, a second encapsulant encapsulating the first traces and a plurality of openings extending through the second encapsulant to expose a surface of the first traces. A plurality of solder bumps is attached to the exposed surface of the first traces. The stacked semiconductor package also includes a second semiconductor package in accordance with the second aspect and further including at least one of a plurality of pads, a plurality of connectors, a plurality of passive components, at least one strengthening element, an electromagnetic shielding structure and an inductor coil encapsulated by the first encapsulant, and a plurality of openings formed in the conductive layer, the openings exposing a surface of the connectors. The solder bumps are electrically coupled to the exposed surface of the connectors of the second semiconductor package.

In a sixth aspect, the present invention provides a stacked semiconductor package. The stacked semiconductor package includes a first semiconductor package in accordance with the second aspect and further including at least one of a plurality of pads, a plurality of connectors, a plurality of passive components, at least one strengthening element, an electromagnetic shielding structure and an inductor coil encapsulated by the first encapsulant, and a plurality of openings formed in the conductive layer, the openings exposing a surface of the connectors. The stacked semiconductor package also includes a second semiconductor package, the second semiconductor package being a wafer-level package having a plurality of solder bumps. The solder bumps are electrically coupled to the exposed surface of the connectors of the first semiconductor package.

In a seventh aspect, the present invention provides a semiconductor package including a first semiconductor chip, a plurality of connectors, a first encapsulant encapsulating the first semiconductor chip and the connectors, and a plurality of electrical connections to the first semiconductor chip and the connectors. A heat release area is arranged to release heat generated by the first semiconductor chip. The heat release area includes one of: a surface of a die pad to which the first semiconductor chip is attached; a surface of a conductive layer to which a die pad is attached, the first semiconductor chip being attached to the die pad; a surface of a conductive layer to which the first semiconductor chip is attached; and a surface area of a heat sink attached to a conductive layer, the first semiconductor chip being attached to the conductive layer.

In an eighth aspect, the present invention provides a stacked semiconductor package including a first semiconductor package in accordance with the seventh aspect and further including a plurality of vias extending though the first encapsulant to the first semiconductor chip, a plurality of first traces on a surface of the first encapsulant, the first traces being electrically connected by the vias to the first semiconductor chip and the connectors being electrically connected to the first traces, a second encapsulant encapsulating the first traces and a plurality of openings extending through the second encapsulant to expose a surface of the first traces. A plurality of solder bumps is attached to the exposed surface of the first traces. The stacked semiconductor package also includes a second semiconductor package in accordance with the seventh aspect and further including a plurality of pads encapsulated by the first encapsulant, the connectors being provided on the pads. The solder bumps are electrically coupled to the pads of the second semiconductor package.

In a ninth aspect, the present invention provides a stacked semiconductor package including first and second semiconductor packages in accordance with the seventh aspect and further including a plurality of pads encapsulated by the first encapsulant, the connectors being provided on the pads. A solder material electrically couples a first die pad of the first semiconductor package to a second die pad of the second semiconductor package and a plurality of first pads of the first semiconductor package to a plurality of second pads of the second semiconductor package.

In a tenth aspect, the present invention provides a stacked semiconductor package including a first semiconductor package in accordance with the seventh aspect and further including a plurality of vias extending though the first encapsulant to the first semiconductor chip, a plurality of first traces on a surface of the first encapsulant, the first traces being electrically connected by the vias to the first semiconductor chip and the connectors being electrically connected to the first traces, a second encapsulant encapsulating the first traces and a plurality of openings extending through the second encapsulant to expose a surface of the first traces. A plurality of solder bumps is attached to the exposed surface of the first traces. The stacked semiconductor package also includes a second semiconductor package in accordance with the seventh aspect and further including a plurality of pads encapsulated by the first encapsulant, the connectors being provided on the pads, and a plurality of openings formed in the conductive layer, the openings exposing a surface of the connectors. The solder bumps are electrically coupled to the exposed surface of the connectors of the second semiconductor package.

In an eleventh aspect, the present invention provides a stacked semiconductor package including a first semiconductor package in accordance with the seventh aspect and further including a plurality of pads encapsulated by the first encapsulant, the connectors being provided on the pads, and a plurality of openings formed in the conductive layer, the openings exposing a surface of the connectors. The stacked semiconductor package also includes a second semiconductor package, the second semiconductor package being a wafer-level package having a plurality of solder bumps. The solder bumps are electrically coupled to the exposed surface of the connectors of the first semiconductor package.

In a twelfth aspect, the present invention provides a semiconductor package including a first semiconductor chip, a plurality of connectors, a first encapsulant encapsulating the first semiconductor chip and the connectors, and a plurality of electrical connections to the first semiconductor chip and the connectors. A heat release area is arranged to release heat generated by the first semiconductor chip. The heat release area includes one of: a surface area of an array of heat sinks attached to a conductive layer, the first semiconductor chip being attached to the conductive layer; a surface area of a plurality of fins attached to a conductive layer, the first semiconductor chip being attached to the conductive layer; and a surface area of a heat sink attached to a conductive layer to which a die pad is attached, the first semiconductor chip being attached to the die pad.

In a thirteenth aspect, the present invention provides a semiconductor package including a first semiconductor chip, an electromagnetic shielding structure, a first encapsulant encapsulating the first semiconductor chip and the electromagnetic shielding structure, and a plurality of electrical connections to the first semiconductor chip and the electromagnetic shielding structure. A heat release area is arranged to release heat generated by the first semiconductor chip. The heat release area includes one of: a surface of a die pad to which the first semiconductor chip is attached; a surface of a conductive layer to which a die pad is attached, the first semiconductor chip being attached to the die pad; a surface of a conductive layer to which the first semiconductor chip is attached; a surface area of a heat sink attached to a conductive layer, the first semiconductor chip being attached to the conductive layer; a surface area of an array of heat sinks attached to a conductive layer, the first semiconductor chip being attached to the conductive layer; a surface area of a plurality of fins attached to a conductive layer, the first semiconductor chip being attached to the conductive layer; and a surface area of a heat sink attached to a conductive layer to which a die pad is attached, the first semiconductor chip being attached to the die pad.

In a fourteenth aspect, the present invention provides a semiconductor package including: a first semiconductor chip, at least one strengthening element, a first encapsulant encapsulating the first semiconductor chip and the at least one strengthening element, and a plurality of electrical connections to the first semiconductor chip. A heat release area is arranged to release heat generated by the first semiconductor chip, the heat release area including one of: a surface of a die pad to which the first semiconductor chip is attached; a surface of a conductive layer to which a die pad is attached, the first semiconductor chip being attached to the die pad; a surface of a conductive layer to which the first semiconductor chip is attached; a surface area of a heat sink attached to a conductive layer, the first semiconductor chip being attached to the conductive layer; a surface area of an array of heat sinks attached to a conductive layer, the first semiconductor chip being attached to the conductive layer; a surface area of a plurality of fins attached to a conductive layer, the first semiconductor chip being attached to the conductive layer; and a surface area of a heat sink attached to a conductive layer to which a die pad is attached, the first semiconductor chip being attached to the die pad.

Other aspects and advantages of the invention will become apparent from the following detailed description, taken in conjunction with the accompanying drawings, illustrating by way of example the principles of the invention.

BRIEF DESCRIPTION OF THE DRAWINGS

The following detailed description of preferred embodiments of the invention will be better understood when read in conjunction with the appended drawings. The present invention is illustrated by way of example and is not limited by the accompanying figures, in which like references indicate similar elements. It is to be understood that the drawings are not to scale and have been simplified for ease of understanding the invention.

DETAILED DESCRIPTION OF THE INVENTION

Figure 1:
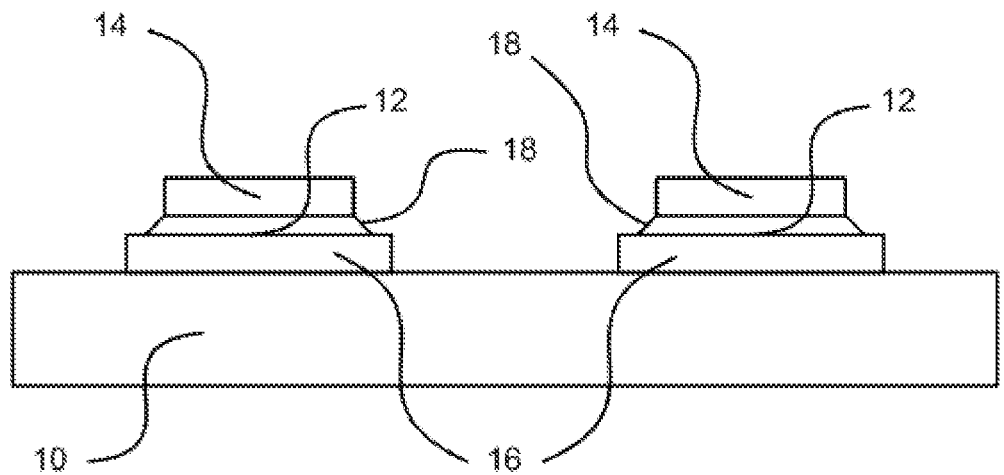
FIGS. 1 through 4 illustrate a semiconductor packaging method in accordance with an embodiment of the present invention.

The detailed description set forth below in connection with the appended drawings is intended as a description of the presently preferred embodiments of the invention, and is not intended to represent the only form in which the present invention may be practiced. It is to be understood that the same or equivalent functions may be accomplished by different embodiments that are intended to be encompassed within the scope of the invention. In the drawings, like numerals are used to indicate like elements throughout.

A semiconductor packaging method will now be described below with reference to FIGS. 1 through 4.

Referring now to FIG. 1, a carrier 10 having a plurality of semiconductor chip receiving areas 12 is provided. A plurality of first semiconductor chips 14 are attached to the semiconductor chip receiving areas 12.

The carrier 10 serves as a support and may be made of any suitable material that is relatively rigid for ease of handling during processing. The carrier 10 may have a thickness of between about 50 millimetres (mm) and about 500 mm. In one embodiment, the carrier 10 may be in the form of a panel made of steel or copper. In an alternative embodiment, the carrier 10 may include a first or base layer and a second or top layer formed of a first conductive material provided on the first layer. The first or base layer may be made of, for example, steel or aluminum and the second or top layer may be made of, for example, copper.

The first semiconductor chips 14 may be any type of circuit such as, for example, a digital signal processor (DSP) or a special function circuit, and are not limited to a particular technology such as complementary metal-oxide-semiconductor (CMOS), or derived from any particular wafer technology. Each of the first semiconductor chips 14 has an active surface and a back surface opposite to the active surface. The first semiconductor chips 14 may have a thickness of between about 30 microns (μm) and about 50 μm.

In the embodiment shown, the semiconductor chip receiving areas 12 include a plurality of die pads 16 provided on the carrier 10. In one embodiment, the die pads 16 may be formed on the carrier 10 by photolithography or electroplating. In an alternative embodiment where the carrier 10 includes a first or support layer and a second or working layer, the die pads 16 may be formed by patterning the second or top layer by etching away portions of the second or top layer.

An adhesive 18 may be used to attach the first semiconductor chips 14 to the die pads 16 with an active surface of the first semiconductor chips 14 facing away from the die pads 16. The adhesive 18 may be pre-deposited on the die pads 16 or a back surface of the first semiconductor chips 14 before attachment. Accordingly, the back surface of the first semiconductor chips 14 may be attached to the die pads 16 by means of the adhesive 18 pre-disposed on the die pads 16 or pre-formed on the back surface of the first semiconductor chips 14. The adhesive 18 may be a material with high thermal conductivity of about 2 watts per metre per Kelvin (W/mK) to about 20 W/mK, such as thermal adhesives from Arctic Silver™.

Figure 2:
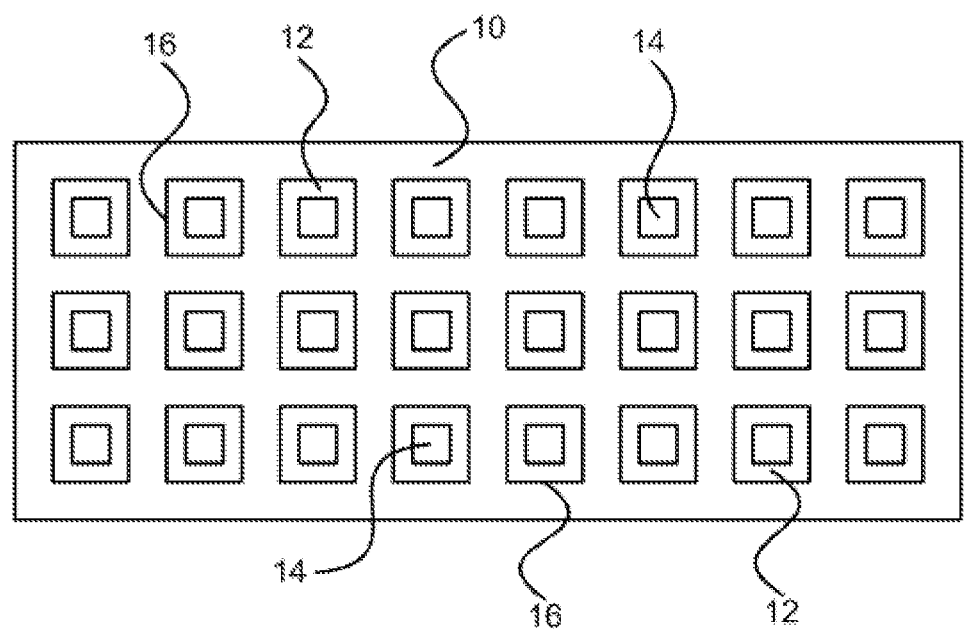

Referring now to FIG. 2, a top plan view of the carrier 10 in the form of a panel is shown. In the embodiment shown, a pattern of die pads 16 is provided on the carrier 10 and a plurality of first semiconductor chips 14 is disposed correspondingly thereon. As can be seen from FIG. 2, although two (2) semiconductor chip receiving areas 12 and two (2) first semiconductor chips 14 are illustrated in FIG. 1, it should be understood that the carrier 10 is not limited by the number of semiconductor chip receiving areas 12 and first semiconductor chips 14 shown and may in fact be used to package a greater number of first semiconductor chips 14 simultaneously. Advantageously, processing a gang of package units simultaneously on a panel scale helps reduce assembly cost.

Figure 3:
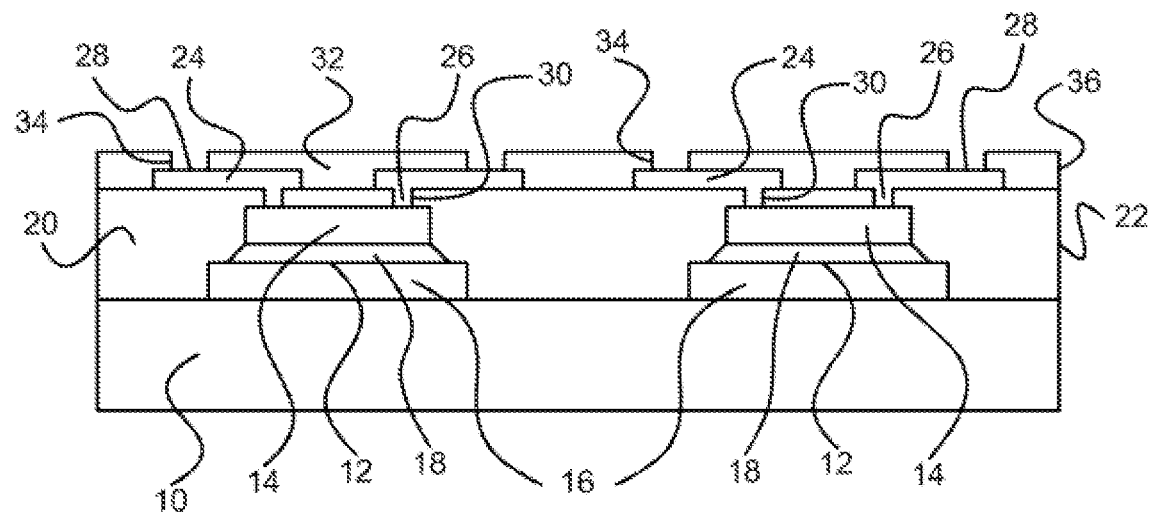

Referring now to FIG. 3, the first semiconductor chips 14 are encapsulated with a first encapsulant 20. A first dielectric layer 22 is thus disposed on the carrier 10 to encapsulate the first semiconductor chips 14 and the die pads 16 and this may be by process of molding, lamination or printing. In one embodiment, the first dielectric layer 22 may be formed using a thermosetting polymer material, such as an epoxy-based or phenol-based compound, in the form of a film sheet or paste. In another embodiment, the material may come in the form of a pellet or powder. Typically, the material may further comprises fillers such as silica. Preferably the first dielectric layer 22 is formed of a Ajinomoto Build-up Film (ABF) or epoxy molding compound (EMC). The first dielectric layer 22 may have a thickness of between about 100 μm and about 800 μm. The thickness of the first dielectric layer 22 may be thinned by grinding or polishing without exposing the first semiconductor chips 14.

After encapsulation, a plurality of electrical connections 24 is formed to the first semiconductor chips 14. In the present embodiment, forming the electrical connections 24 to the first semiconductor chips 14 includes forming a plurality of first vias 26 extending though the first encapsulant 20 to the first semiconductor chips 14, and forming a plurality of first traces 28 on a surface of the first encapsulant 20, the first traces 28 being electrically connected by the first vias 26 to the first semiconductor chips 14.

The first vias 26 may be formed by forming a plurality of first openings 30 in the first dielectric layer 22 to expose an active surface of the first semiconductor chips 14, the locations of the first openings 30 correspond to input/output (I/O) pad locations on the active surface of the first semiconductor chips 14. The first openings 30 may be formed by laser drilling or photolithography.

The first vias 26 and the first traces 28 may be formed by a semi-additive electroplating process. More particularly, a metal seed layer may be deposited on the surface of the first dielectric layer 22 and the sidewalls of the first openings 30 by electroless plating. Thereafter, the first vias 26 are formed in the first openings 30 and the first traces 28 are formed on the seed layer with a conductive material such as, for example, copper. Exposed portions of the seed layer are then removed. The first vias 26 electrically connect I/O pads on the active surface of the first semiconductor chips 14 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The second dielectric layer 36 may be formed by screening printing using, for example, a soldermask and the second openings 34 may be formed in the second dielectric layer 36 by photolithography. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

Figure 4:
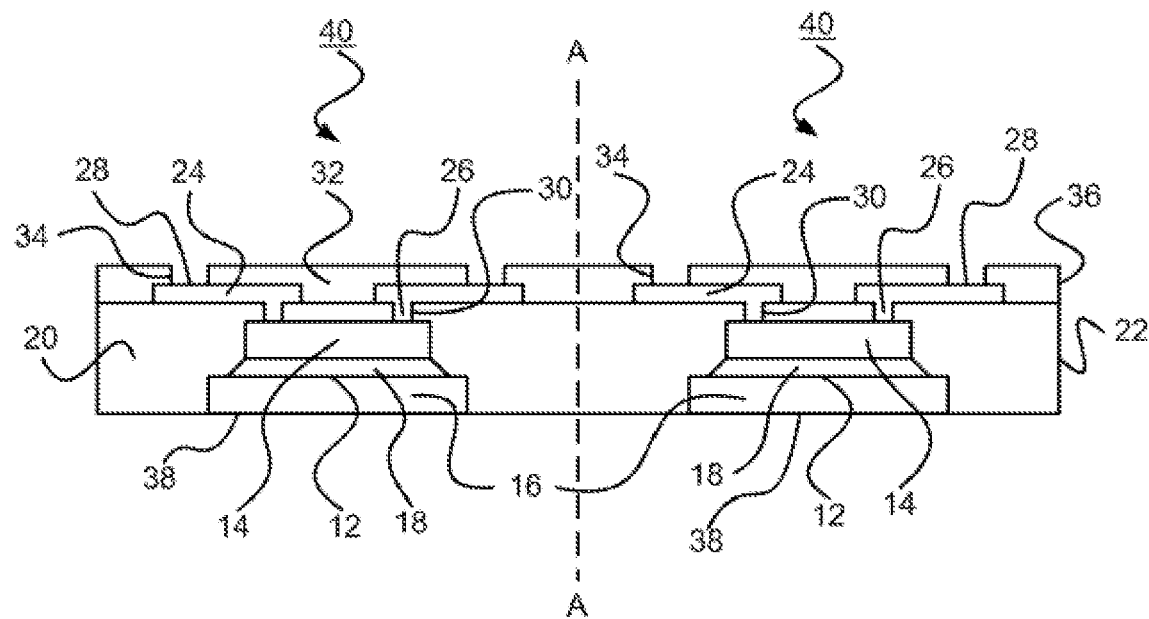

Referring now to FIG. 4, at least a portion of the carrier 10 is removed to provide a heat release area 38. In the present embodiment, the heat release area 38 is an exposed surface area of the die pads 16 after removal of the carrier 10. The carrier 10 may be removed by chemical etching or physical separation to expose the die pads 16. The exposed surface area of the die pads 16 may be coated with an anti-corrosion or anti-oxidation layer such as, for example, nickel (Ni) or an organic solderability preservative (OSP).

After removal of the carrier 10 to expose the die pads 16, a plurality of semiconductor packages 40 thus formed may be separated along the vertical line A-A into individual package units by laser or mechanical dicing.

As can be seen from FIG. 4, each of the semiconductor packages 40 includes a first semiconductor chip 14, a first encapsulant 20 encapsulating the first semiconductor chip 14, a plurality of electrical connections 24 to the first semiconductor chip 14, and a heat release area 38 arranged to release heat generated by the first semiconductor chip 14. In the present embodiment, the heat release area 38 includes a surface of a die pad 16 to which the first semiconductor chip 14 is attached.

In the embodiment shown, the electrical connections 24 to the first semiconductor chip 14 includes a plurality of first vias 26 extending though the first encapsulant 20 to the first semiconductor chip 14, and a plurality of first traces 28 on a surface of the first encapsulant 20. The first traces 28 are electrically connected by the first vias 26 to the first semiconductor chip 14. A second encapsulant 32 encapsulates the first traces 28, and a plurality of openings 34 extends through the second encapsulant 32 to expose a surface of the first traces 28. Alternatively, the second encapsulant may be omitted and the first traces 28 is completely exposed on the first dielectric layer 22 for connection to external devices or circuits.

Advantageously, thin profile semiconductor packages 40 with a thickness of between about 150 μm and about 200 μm may be formed with the described semiconductor packaging method.

Alternative package forms with different types of electrical connections 24 to the first semiconductor chip 14 will now be described below with reference to FIGS. 5 through 7.

Figure 5:
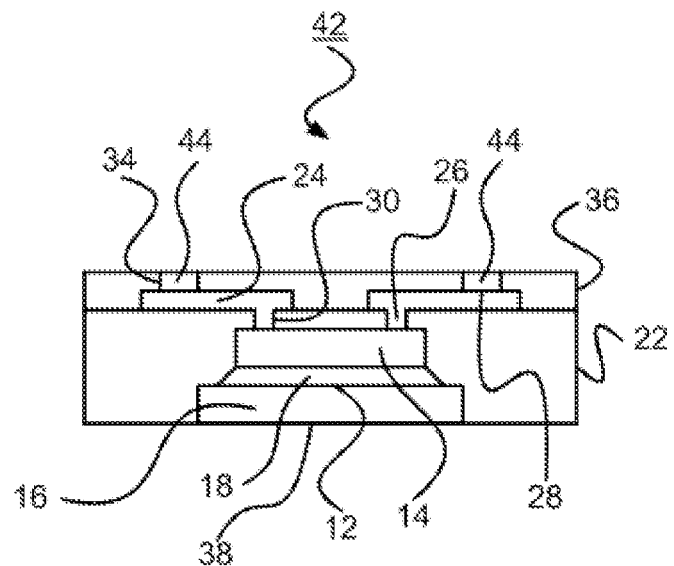
FIGS. 5 through 7 are enlarged cross-sectional views of semiconductor packages in accordance with embodiments of the present invention.

Referring now to FIG. 5, a semiconductor package 42 is shown. The semiconductor packaging method by which the semiconductor package 42 is formed differs from the earlier embodiment in that the step of forming the electrical connections 24 to the first semiconductor chips 14 includes forming a plurality of first conductive studs 44 on the first traces 28. The first conductive studs 44 may be formed on the first traces 28 by photolithography and electroplating.

Thereafter, the first traces 28 and the first conductive studs 44 are encapsulated with a second encapsulant 32. A second dielectric layer 36 is thus formed on the first dielectric layer 22, the second dielectric layer 36 encapsulating the first traces 28 and the first conductive studs 44. The second dielectric layer 36 may be formed on the first dielectric layer 22 by process of molding, lamination or printing. In one embodiment, the second dielectric layer 36 is formed using a thermosetting polymer material, such as an epoxy-based or phenol-based compound, in the form of a film sheet or paste. In another embodiment, the material may come in the form of a pellet or powder. Typically, the material may further comprise fillers such as silica. Preferably the second dielectric layer 36 is formed of a Ajinomoto Build-up Film (ABF) or epoxy molding compound (EMC).

A portion of the second encapsulant 32 is then removed to expose a surface of the first conductive studs 44. In one embodiment, the second dielectric layer 36 may be thinned down to expose the surface of the first conductive studs 44 by grinding or polishing. The exposed surface of the first conductive studs 44 may be coated with a finishing layer such as, for example, tin (Sn), a nickel/gold (Ni/Au) layering or an organic solderability preservative (OSP).

The semiconductor package 42 shown in FIG. 5 differs from the semiconductor package 40 shown in FIG. 4 in that the semiconductor package 42 includes a plurality of first conductive studs 44 on the first traces 28, and a second encapsulant 32 encapsulates the first traces 28 and the first conductive studs 44. A portion of the second encapsulant 32 is removed, exposing a surface of the first conductive studs 44.

Figure 6:
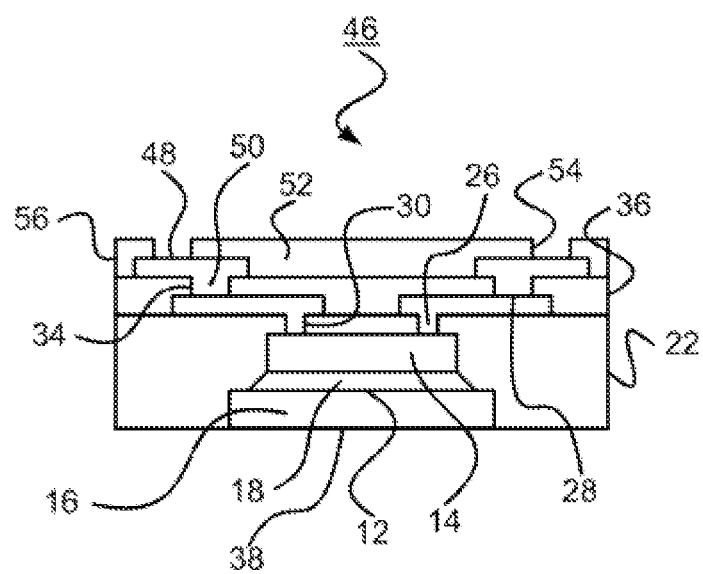

Referring now to FIG. 6, a semiconductor package 46 is shown. The semiconductor packaging method by which the semiconductor package 46 is formed differs from the previous embodiments in that the step of forming the electrical connections 24 to the first semiconductor chips 14 further includes forming a plurality of second traces 48 on a surface of the second encapsulant 32. In the present embodiment, a plurality of second vias 50 is formed in the second openings 34. Accordingly, the locations of the second openings 34 correspond to predetermined via locations on the surface of the first traces 28. The second traces 48 and the second vias 50 may be formed by a semi-additive electroplating process. More particularly, a metal seed layer may be deposited on the surface of the second dielectric layer 36 and the sidewalls of the second openings 34 by electroless plating. Thereafter, the second vias 50 are formed in the second openings 34 and the second traces 48 are formed on the seed layer with a conductive material such as, for example, copper. Exposed portions of the seed layer are then removed. The second vias 50 electrically connect the first traces 28 to the second traces 48.

The semiconductor package 46 may be completed by encapsulating the second traces 48 with a third encapsulant 52, and forming a plurality of third openings 54 through the third encapsulant 52 to expose a surface of the second traces 48. A third dielectric layer 56 is thus formed on the second dielectric layer 36, the third dielectric layer 56 encapsulating the second traces 48. The third dielectric layer 56 may be formed by screening printing using, for example, a soldermask and the third openings 54 may be formed in the third dielectric layer 56 by photolithography. The exposed surface of the second traces 48 may be coated with a finishing layer, such as, for example, tin (Sn), a nickel/gold (Ni/Au) layering or an organic solderability preservative (OSP). The third openings 54 may subsequently be filled with a conductive material such as, for example, solder paste.

Figure 7:
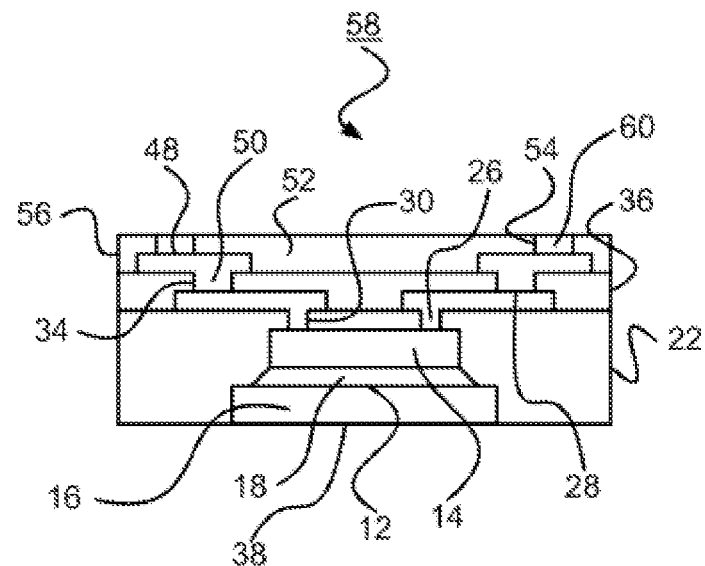

Referring now to FIG. 7, a semiconductor package 58 is shown. The semiconductor packaging method by which the semiconductor package 58 is formed differs from the previous embodiment in that the semiconductor package 58 is completed by forming a plurality of second conductive studs 60 on the second traces 48. The second conductive studs 60 may be formed on the second traces 48 by photolithography and electroplating.

Thereafter, the second traces 48 and the second conductive studs 60 are encapsulated with a third encapsulant 52. A third dielectric layer 56 is thus formed on the second dielectric layer 36, the third dielectric layer 56 encapsulating the second traces 48 and the second conductive studs 60. The third dielectric layer 56 may be formed on the second dielectric layer 36 by process of molding, lamination or printing. In one embodiment, the third dielectric layer 56 is formed using a thermosetting polymer material, such as an epoxy-based or phenol-based compound, in the form of a film sheet or paste. In another embodiment, the material may come in the form of a pellet or powder. Typically, the material may further comprises fillers such as silica. Preferably the third dielectric layer 56 is formed of a Ajinomoto Build-up Film (ABF) or epoxy molding compound (EMC).

A portion of the third encapsulant 52 is then removed to expose a surface of the second conductive studs 60. In one embodiment, the third dielectric layer 56 may be thinned down to expose the surface of the second conductive studs 60 by grinding or polishing. The exposed surface of the second conductive studs 60 may be coated with a finishing layer such as, for example, tin (Sn), a nickel/gold (Ni/Au) layering or an organic solderability preservative (OSP).

The semiconductor package 46 shown in FIG. 6 and the semiconductor package 58 shown in FIG. 7 differ from the earlier embodiments in that the semiconductor packages 46 and 58 further include a plurality of second traces 48 on a surface of the second encapsulant 32 and are formed with multiple electrical connection layers. Similar steps may be repeated to obtain semiconductor packages having more multiple layers electrical connection layer for greater routing density and higher functionality applications.

In the embodiments described above, the semiconductor packages 40, 42, 46 and 58 are formed with a planar package back surface and a sunk-in thermal pad or die pad 16.

Various methods of prepping the first semiconductor chip 14 for formation of the first vias 12 and/or forming the first vias 12 will now be described below with reference to FIGS. 8 through 12.

Figure 8:
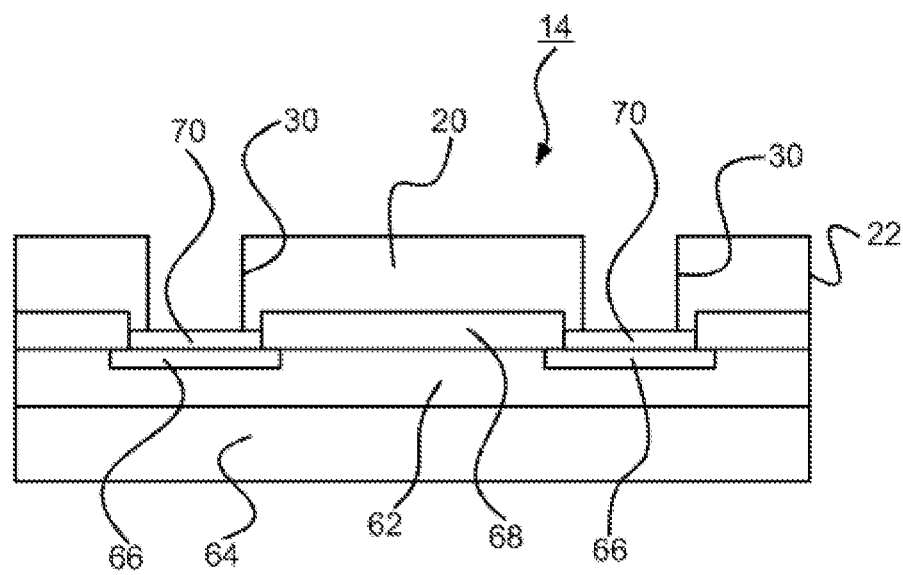
FIGS. 8 through 12 illustrate additional processing steps in the semiconductor packaging method in accordance with various embodiments of the present invention.

Referring now to FIG. 8, an enlarged sectional view of a portion of an active surface of the first semiconductor chip 14 is shown. The first semiconductor chip 14 includes a circuit layer 62 provided on a bulk silicon layer 64, a plurality of circuit pads 66 electrically connected to the circuit layer 62 and a passivation layer 68 provided over the circuit layer 62 exposing an area of the circuit pads 66 on the active surface of the first semiconductor chip 14. In an alternative embodiment, a repassivation layer (not shown) may be provided over the passivation layer 68, the repassivation layer exposing a smaller area of the circuit pads 66.

The circuit pads 66 may be formed of aluminum (Al), the passivation layer 68 may be formed of silicon nitride (SiN) or silicon dioxide (SiO) and the repassivation layer may be formed of polyimide.

In the present embodiment, the semiconductor packaging method further includes forming an electrically conductive layer 70 over at least one of the circuit pads 66 of the first semiconductor chip 14 prior to forming the electrical connections 24 to the first semiconductor chip 14. Accordingly, a semiconductor package thus formed further includes an electrically conductive layer 70 over at least one of a plurality of circuit pads 66 of the first semiconductor chip 14.

The electrically conductive layer 70 may be formed by electroless plating of nickel, copper, gold finishing or a nickel/copper (Ni/Cu) layering or a nickel/gold (Ni/Au) layering on the circuit pads 66.

In a subsequent step of forming the first openings 30 in the first dielectric layer 22, the first openings 30 expose only the electrically conductive layer 70 on the active surface of the first semiconductor chip 14. The area of the first openings 30 in the first dielectric layer 22 is thus smaller than the surface area of the electrically conductive layer 70 formed over each of the circuit pads 66. Accordingly, in a subsequent step of forming the first vias 26, the first vias 26 are only formed on a portion of the electrically conductive layer 70 exposed by the first openings 30.

Figure 9:
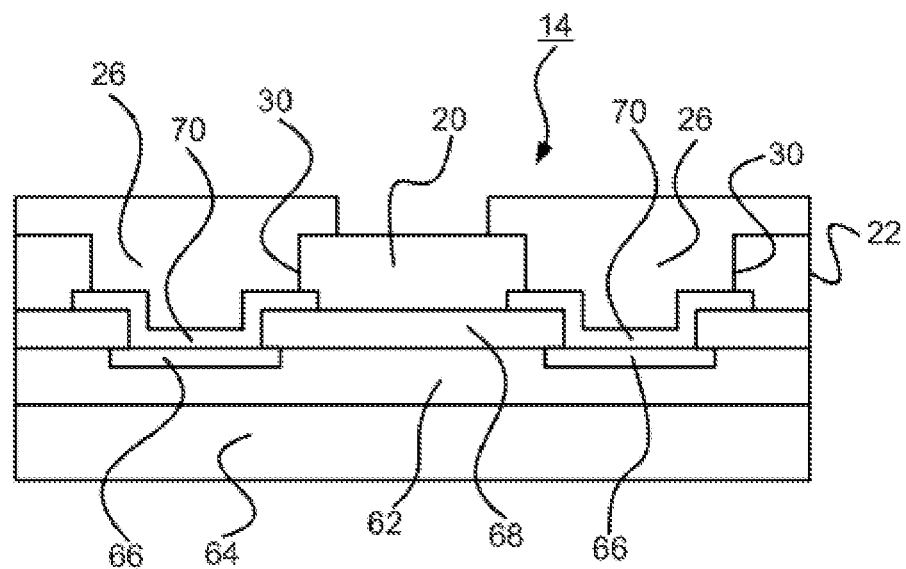

Referring now to FIG. 9, an alternative form of the electrically conductive layer 70 is shown. In the embodiment shown, a surface area of the electrically conductive layer 70 is greater than a surface area of the circuit pad 66 over which the electrically conductive layer 70 is formed.

The electrically conductive layer 70 of the present embodiment may be formed by sputtering the passivation layer 68 with a seed layer of a titanium-tungsten/copper (TiW/Cu) layering or a titanium/copper (Ti/Cu) layering, disposing a photoresist layer on the seed layer, processing the photoresist layer to form a pattern of openings exposing portions of the seed layer, electroplating copper (Cu) on the exposed portions of the seed layer corresponding to the locations of the circuit pads 66, removing the photoresist layer, and etching away the exposed seed layer to expose the passivation layer 68.

In the present embodiment where the width and surface area of the electrically conductive layer 70 is greater than a width and surface area of the circuit pad 66 over which the electrically conductive layer 70 is formed, portions of the electrically conductive layer 70 extend onto the passivation layer 68 around the circuit pads 66. Advantageously, the larger width and surface area of the electrically conductive layer 70 compared to the width and surface area of the circuit pad 66 provides greater flexibility and tolerance in terms of the size and/or positioning of the subsequently formed first openings 30 and first vias 26 as in such an embodiment, the first openings 30 and the subsequent first vias 26 may be formed outside the area of the circuit pads 66. This makes formation of a larger first via 26 possible, the larger first via 26 with greater area and volume providing greater mechanical strength and better thermal and electrical performance. A larger first via 26 is also better able to accommodate an offset when the first openings 30 are formed by laser firing. This increases the reliability of the semiconductor packages formed.

Further advantageously, in both the embodiments shown in FIGS. 8 and 9, because the first openings 30 and the first vias 26 are formed on the electrically conductive layer 70, the interface between the first encapsulant 20 and the passivation layer 68 is prevented from coming into direct contact with chemicals used in the subsequent processing steps and this helps to prevent damage of the passivation layer 68, for example, from delamination, in the subsequent processing steps.

Figure 10:
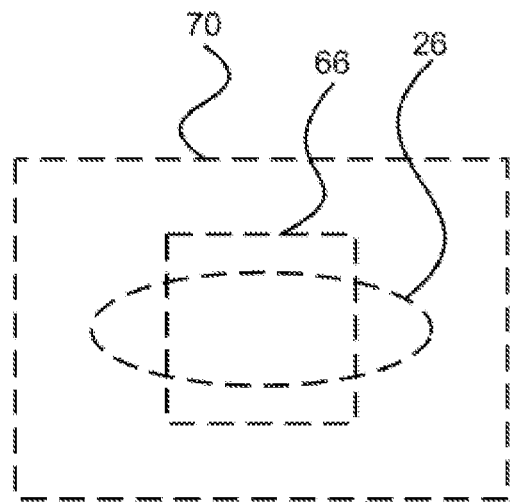

Referring now to FIG. 10, a schematic plan view of the circuit pad 66 over which the electrically conductive layer 70 of FIG. 9 and the first via 26 are formed is shown. In the embodiment shown, the first via 26 is formed in an oval shape. Advantageously, this allows for a narrower pitch between the subsequently formed first traces 28.

In alternative embodiments, the first openings 30 and the first vias 26 may be formed of other shapes such as, for example, a circular shape or a rectangular shape. The first openings 30 may also be formed of a series of overlapping laser firings to provide an opening with an elongate shape.

Figure 11:
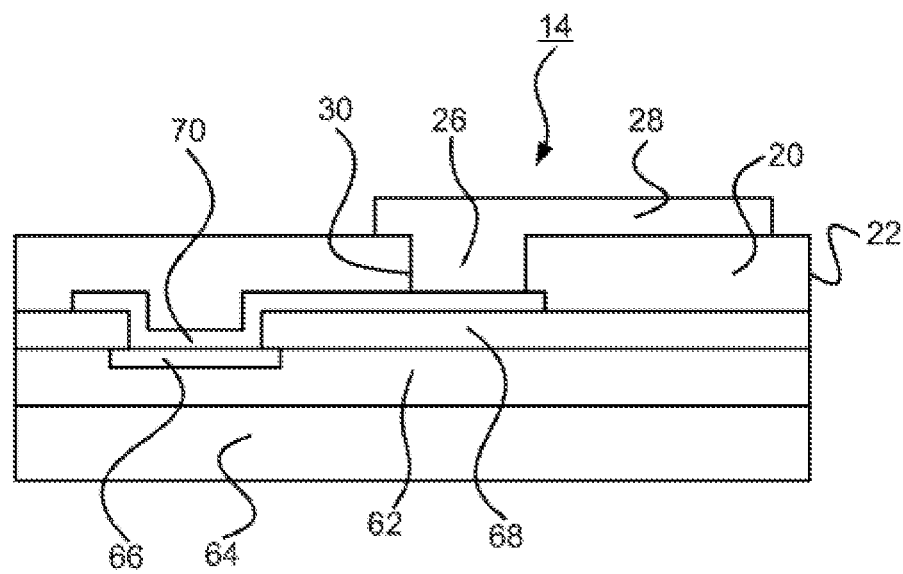

Referring now to FIG. 11, another form of the electrically conductive layer 70 is shown. In the embodiment shown, the electrically conductive layer 70 includes a pad portion 72 positioned above the circuit pad 66 over which the electrically conductive layer 70 is formed and a line portion 74 extending away from the circuit pad 66. In the present embodiment, the electrical connections 24 to the first semiconductor chip 14 are formed from the line portion 74 of the electrically conductive layer 70.

In the embodiment shown, the pad portion 72 of the electrically conductive layer 70 covers the circuit pad 66 and the line portion of the electrically conductive layer 70 extends away on the passivation layer 68 from the location of the circuit pad 66 to the location of the first opening 30. The first opening 30 and the first via 26 are thus formed away from the circuit pad 66. In this manner, and advantageously, the electrically conductive layer 70 provides another layer for routing of electrical signals prior to connecting to the first vias 26 and the first traces 28.

Figure 12:
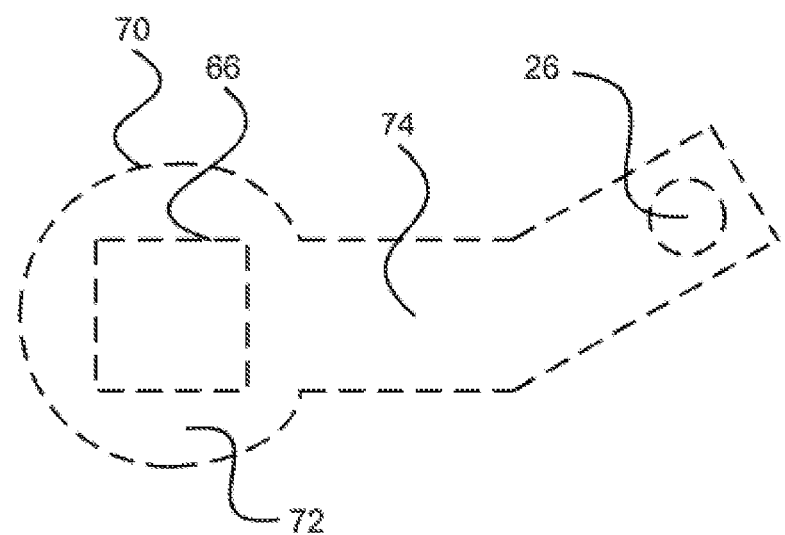

Referring now to FIG. 12, a schematic plan view of the circuit pad 66 over which the electrically conductive layer 70 of FIG. 11 and the first via 26 are formed is shown. As can be seen from FIG. 12, an area of the pad portion 72 of the electrically conductive layer 70 is greater than a corresponding area of the circuit pad 66 such that the pad portion 72 covers the whole of the circuit pad 66. In the embodiment shown, a width of the line portion 74 of the electrically conductive layer 70 is greater than a width of the first opening 30 and the first via 26. The first opening 30 exposes only a portion of the line portion 74 of the electrically conductive layer 70 and the first via 26 is formed only on the exposed area of the line portion 74.

In the present embodiment, the first via 26 is formed in a circular shape. In alternative embodiments, the first openings 30 and the first vias 26 may be formed of other shapes such as, for example, an oval shape or a rectangular shape with a major axis parallel to a length of the line portion 74. The first openings 30 may also be formed of a series of overlapping laser firings to provide an opening with an elongate shape. An elongate shape such as an oval or a rectangular shape increases a contact area between the first via 26 and the first traces 28, increasing mechanical strength and providing better thermal and electrical performance.

Another semiconductor packaging method will now be described below with reference to FIGS. 13 through 15.

Figure 13:
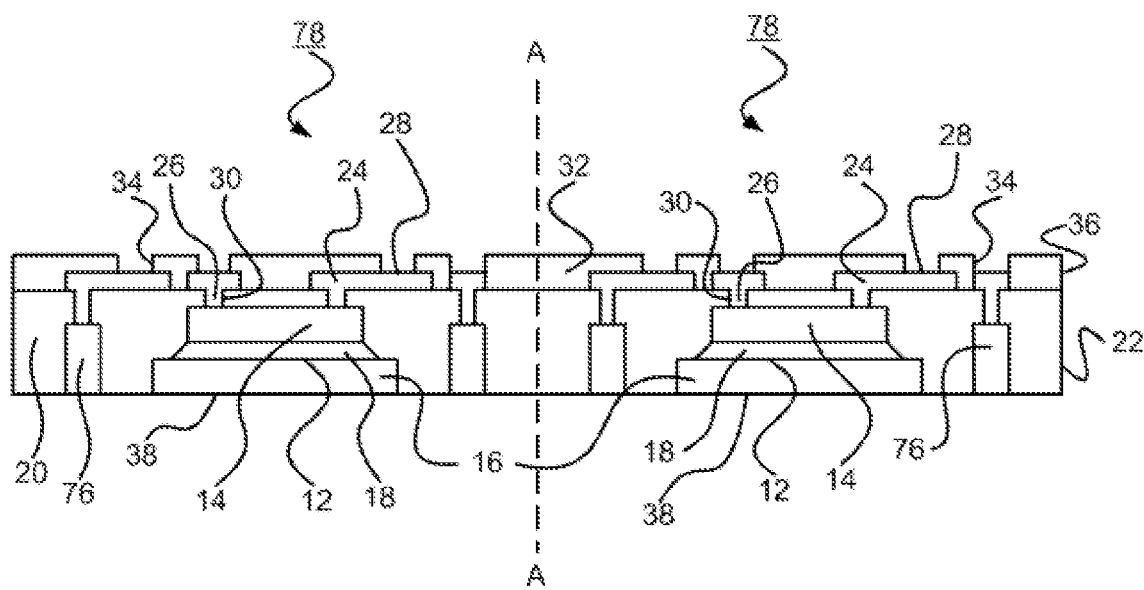
FIGS. 13 through 15 illustrate a semiconductor packaging method in accordance with another embodiment of the present invention.

Referring now to FIG. 13, the semiconductor packaging method of the present embodiment differs from the earlier embodiments in that the semiconductor packaging method includes forming a plurality of connectors or columns 76 on the carrier 10 prior to the encapsulation step.

Figure 14:
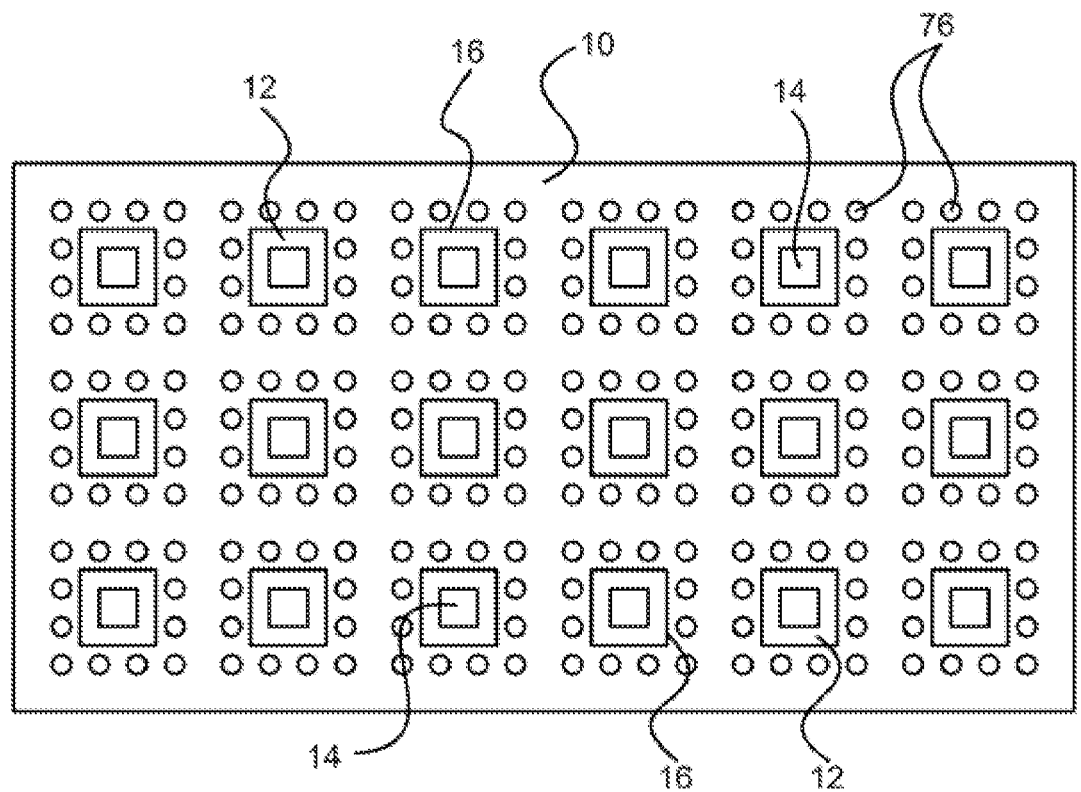

Referring now to FIG. 14, the connectors 76 may be disposed away from the die pads, preferably around the die pads 16 as shown.

Referring again to FIG. 13, the connectors 76 may be formed to a level lower than a surface of the first semiconductor chips 14 in the present embodiment. In such an embodiment, a surface of the connectors 76 is lower than an active surface of the first semiconductor chips 14 and the active surface of the first semiconductor chips 14 is further away from the carrier 10 than the surface of the connectors 76.

The first semiconductor chips 14 and the connectors 76 are then encapsulated with a first encapsulant 20. A first dielectric layer 22 is thus disposed on the carrier 10 to encapsulate the first semiconductor chips 14, the die pads 16 and the connectors 76, and this may be by process of molding, lamination or printing. In one embodiment, the first dielectric layer 22 may be formed using using a thermosetting polymer material, such as an epoxy-based or phenol-based compound, in the form of a film sheet or paste. In another embodiment, the material may come in the form of a pellet or powder. Typically, the material may further comprises fillers such as silica. Preferably the first dielectric layer 22 is formed of a Ajinomoto Build-up Film (ABF) or epoxy molding compound (EMC). The first dielectric layer 22 may have a thickness of between about 100 µm and about 800 µm. The thickness of the first dielectric layer 22 may be thinned by grinding or polishing without exposing the first semiconductor chips 14 and the connectors 76.

After encapsulation, a plurality of electrical connections 24 is formed to the first semiconductor chips 14 and the connectors 76. In the present embodiment, forming the electrical connections 24 to the first semiconductor chips 14 includes forming a plurality of first openings 30 through the first dielectric layer 22 to expose an active surface of the first semiconductor chips 14 and a surface of the connectors 76. This may be by laser drilling. The locations of the first openings 30 correspond to the I/O pad locations on the active surface of the first semiconductor chips 14 and the locations of the connectors 76 on the carrier 10.

A plurality of first vias 26 extending though the first encapsulant 20 to the first semiconductor chips 14 and the connectors 76 and a plurality of first traces 28 on a surface of the first encapsulant 20 are then formed. The first traces 28 are electrically connected by the first vias 26 to the first semiconductor chips 14.

The first vias 26 and the first traces 28 may be formed by a semi-additive electroplating process. More particularly, a metal seed layer may be deposited on the surface of the first dielectric layer 22 and the sidewalls of the first openings 30 by electroless plating. Thereafter, the first vias 26 are formed in the first openings 30 and the first traces 28 are formed on the seed layer with a conductive material such as, for example, copper. Exposed portions of the seed layer are then removed. The first vias 26 electrically connect I/O pads on the active surface of the first semiconductor chips 14 and the connectors 76 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The second dielectric layer 36 may be formed by screening printing using, for example, a soldermask and the second openings 34 may be formed in the second dielectric layer 36 by photolithography. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is then removed to provide a heat release area 38. In the present embodiment, the heat release area 38 is an exposed surface area of the die pads 16 after removal of the carrier 10. In the embodiment shown, a surface of the connectors 76 is also exposed after removing the at least a portion of the carrier 10.

The carrier 10 may be removed by chemical etching or physical separation to expose the die pads 16 and the surface of the connectors 76. The exposed surface area of the die pads 16 and the surface of the connectors 76 may be coated with an anti-corrosion or anti-oxidation layer such as, for example, nickel (Ni) or an organic solderability preservative (OSP).

After removal of the carrier 10 to expose the die pads 16 and the surface of the connectors 76, a plurality of semiconductor packages 78 thus formed may be separated along the vertical line A-A into individual package units by laser or mechanical dicing.

As can be seen from FIG. 13, each of the semiconductor packages 78 thus formed differs from the semiconductor package 40 of FIG. 4 in that the semiconductor package 78 includes a plurality of connectors 76 encapsulated by the first encapsulant 20. Preferably, the first vias 26 connected to the connectors 76 have a smaller area than that of the connectors 76 and thus reduces the necessary contact area to the first traces 28. This improves the routability of the electrical connection layer of the first traces.

Figure 15:
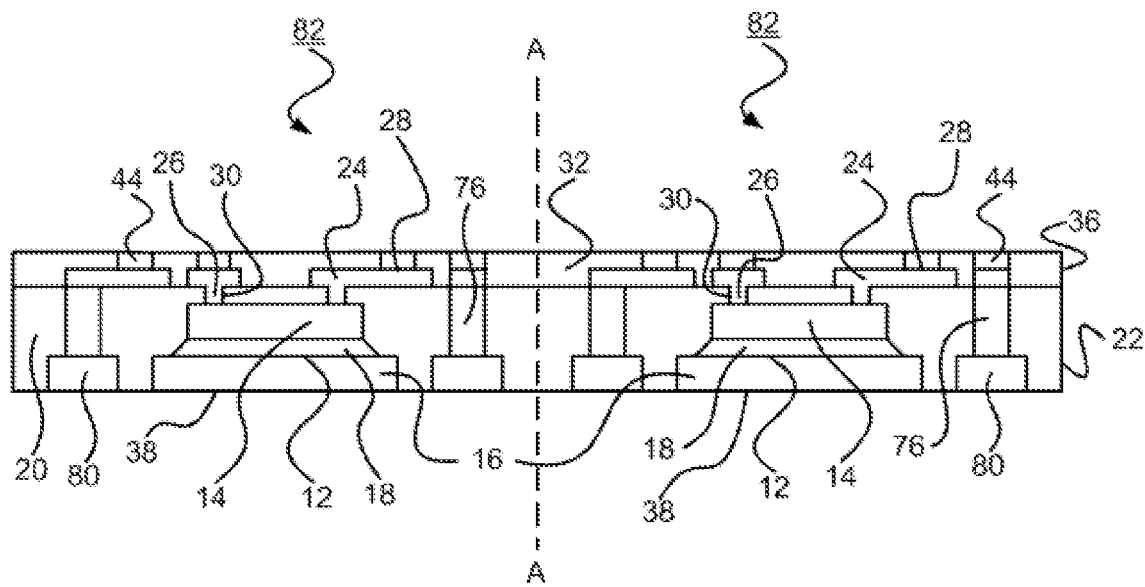

Referring now to FIG. 15, another semiconductor packaging method will now be described. The semiconductor packaging method of the present embodiment differs from the previous embodiment in that the semiconductor packaging method includes forming a plurality of pads 80 on the carrier 10 prior to the encapsulation step.

In one embodiment, the pads 80 may be formed on the carrier 10 by photolithography or electroplating. In an alternative embodiment where the carrier 10 includes a first or support layer and a second or working layer, the pads 80 may be formed by patterning the second or working layer by etching away portions of the second or working layer.

In the present embodiment, a plurality of connectors or columns 76 is formed on the pads 80. Each of the pads 80 of the present embodiment has a larger surface area than the corresponding connector 76. The pads 80 and the connectors 76 may be disposed around the die pads 16.

A further difference between the semiconductor packaging method of the present embodiment and the previous embodiment is that in the present embodiment, the connectors 76 are formed to a level higher than a surface of the first semiconductor chips 14. In such an embodiment, a surface of the connectors 76 is higher than an active surface of the first semiconductor chips 14 and the active surface of the first semiconductor chips 14 is nearer to the carrier 10 than the surface of the connectors 76.

The first semiconductor chips 14 and the connectors 76 are then encapsulated with a first encapsulant 20. A first dielectric layer 22 is thus disposed on the carrier 10 to encapsulate the first semiconductor chips 14, the die pads 16, the connectors 76 and the pads 80, and this may be by process of molding, lamination or printing. In one embodiment, the first dielectric layer 22 may be formed using a thermosetting polymer material, such as an epoxy-based or phenol-based compound in the form of a film sheet or paste. In another embodiment, the material may come in the form of a pellet or powder. Typically, the material may further comprises fillers such as silica. Preferably the first dielectric layer 22 is formed of a Ajinomoto Build-up Film (ABF) or epoxy molding compound (EMC). The first dielectric layer 22 may have a thickness of between about 100 µm and about 800 µm. The thickness of the first dielectric layer 22 may be thinned by grinding or polishing to expose a surface of the connectors 76.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. This may be by laser drilling. The locations of the first openings 30 correspond to the I/O pad locations on the active surface of the first semiconductor chips 14.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14. The first traces 28 are also electrically connected to the connectors 76.

The first vias 26 and the first traces 28 may be formed by a semi-additive electroplating process. More particularly, a metal seed layer may be deposited on the surface of the first dielectric layer 22 and the sidewalls of the first openings 30 by electroless plating. Thereafter, the first vias 26 are formed in the first openings 30 and the first traces 28 are formed on the seed layer with a conductive material such as, for example, copper. Exposed portions of the seed layer are then removed. The first vias 26 electrically connect I/O pads on the active surface of the first semiconductor chips 14 to the first traces 28. Consequent to the formation of the first traces 28, some of the connectors 76 may become further extended upwards from the surface of the first dielectric layer 22.

In the present embodiment, the step of forming the electrical connections 24 to the first semiconductor chips 14 includes forming a plurality of first conductive studs 44 on the first traces 28. The first conductive studs 44 may be formed on the first traces 28 by photolithography and electroplating.

Thereafter, the first traces 28 and the first conductive studs 44 are encapsulated with a second encapsulant 32. A second dielectric layer 36 is thus formed on the first dielectric layer 22, the second dielectric layer 36 encapsulating the first traces 28 and the first conductive studs 44. The second dielectric layer 36 may be formed on the first dielectric layer 22 by process of molding, lamination or printing. In one embodiment, the second dielectric layer 36 is formed using a thermosetting polymer material, such as an epoxy-based or phenol-based compound, in the form of a film sheet or paste. In another embodiment, the material may come in the form of a pellet or powder. Typically, the material may further comprises fillers such as silica. Preferably the first dielectric layer 22 is formed of a Ajinomoto Build-up Film (ABF) or epoxy molding compound (EMC).

A portion of the second encapsulant 32 is then removed to expose a surface of the first conductive studs 44. In one embodiment, the second dielectric layer 36 may be thinned down to expose the surface of the first conductive studs 44 by grinding or polishing. The exposed surface of the first conductive studs 44 may be coated with a finishing layer such as, for example, tin (Sn), a nickel/gold (Ni/Au) layering or an organic solderability preservative (OSP).

At least a portion of the carrier 10 is then removed to provide a heat release area 38. In the present embodiment, the heat release area 38 is an exposed surface area of the die pads 16 after removal of the carrier 10. In the embodiment shown, a surface of the pads 80 is also exposed after removing the at least a portion of the carrier 10.

The carrier 10 may be removed by chemical etching or physical separation to expose the die pads 16 and the surface of the pads 80. The exposed surface area of the die pads 16 and the surface of the pads 80 may be coated with an anti-corrosion or anti-oxidation layer such as, for example, nickel (Ni) or an organic solderability preservative (OSP).

After removal of the carrier 10 to expose the die pads 16 and the surface of the pads 80, a plurality of semiconductor packages 82 thus formed may be separated along the vertical line A-A into individual package units by laser or mechanical dicing.

As can be seen from FIG. 15, each of the semiconductor packages 82 thus formed differs from the semiconductor package 78 of FIG. 13 in that the semiconductor package 78 includes a plurality of connectors 76 and a plurality of pads 80 encapsulated by the first encapsulant 20.

Advantageously, provision of the connectors 76 in the embodiments described above with reference to FIGS. 13 through 15 facilitates formation of multi-chip semiconductor packages and stacked semiconductor packages.

Various multi-chip package structures that may be formed with the semiconductor packaging method described above will now be described below with reference to FIGS. 16 through 18.

Figure 16:
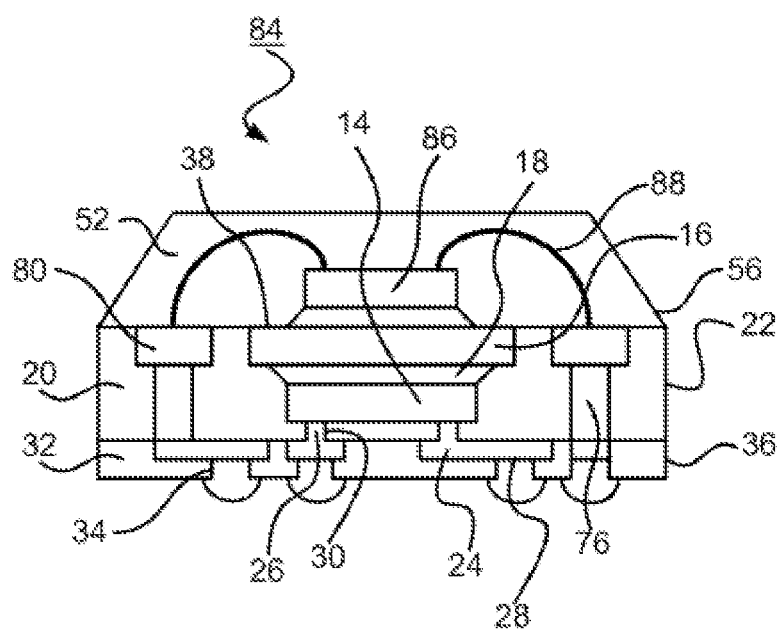
FIGS. 16 through 18 are enlarged cross-sectional views of multi-chip semiconductor packages in accordance with embodiments of the present invention.

Referring now to FIG. 16, a multi-chip semiconductor package 84 is shown. The multi-chip semiconductor package 84 includes a first semiconductor chip 14, a first encapsulant 20 encapsulating the first semiconductor chip 14, a plurality of electrical connections 24 to the first semiconductor chip 14, and a heat release area 38 arranged to release heat generated by the first semiconductor chip 14. In the present embodiment, the heat release area 38 includes a surface of a die pad 16 to which the first semiconductor chip 14 is attached. In the embodiment shown, a plurality of connectors 76 and a plurality of pads 80 to which the connectors are attached are also encapsulated by the first encapsulant 20.

In the present embodiment, a second semiconductor chip is attached to the die pad 16. A plurality of wire bonds 88 electrically connects the second semiconductor chip 86 to respective ones of the pads 80. A third encapsulant 52 encapsulates the second semiconductor chip 86 and the wire bonds 88.

Figure 17:
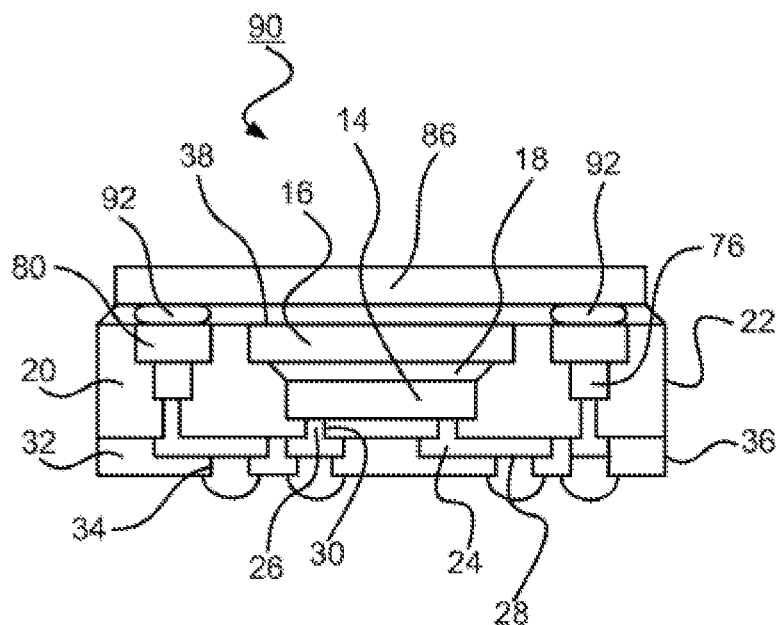

Referring now to FIG. 17, another multi-chip semiconductor package 90 is shown. The multi-chip semiconductor package 84 differs from the previous embodiment in that the multi-chip semiconductor package 84 includes a second semiconductor chip 86 attached to the die pad 16, and a plurality of solder bumps 92 electrically connect the second semiconductor chip 86 to respective ones of the pads 80.

Figure 18:
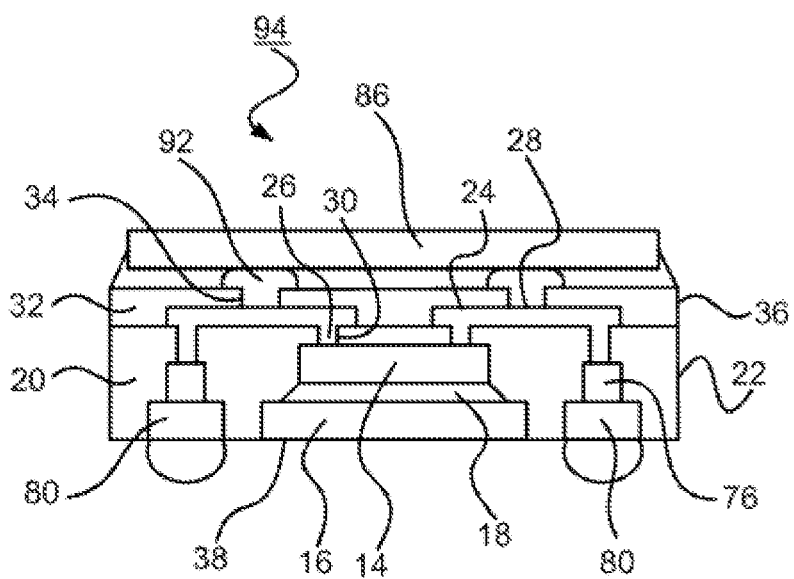

Referring now to FIG. 18, yet another multi-chip semiconductor package 94 is shown. The multi-chip semiconductor package 94 differs from the previous embodiment in that the multi-chip semiconductor package 94 includes a second semiconductor chip 86 having a plurality of solder bumps 92 attached, the solder bumps 92 electrically connecting the second semiconductor chip 86 to the exposed surface of the first traces 28.

Various stacked semiconductor packages that may be formed with the semiconductor packaging method described above will now be described below with reference to FIGS. 19 and 20.

Figure 19:
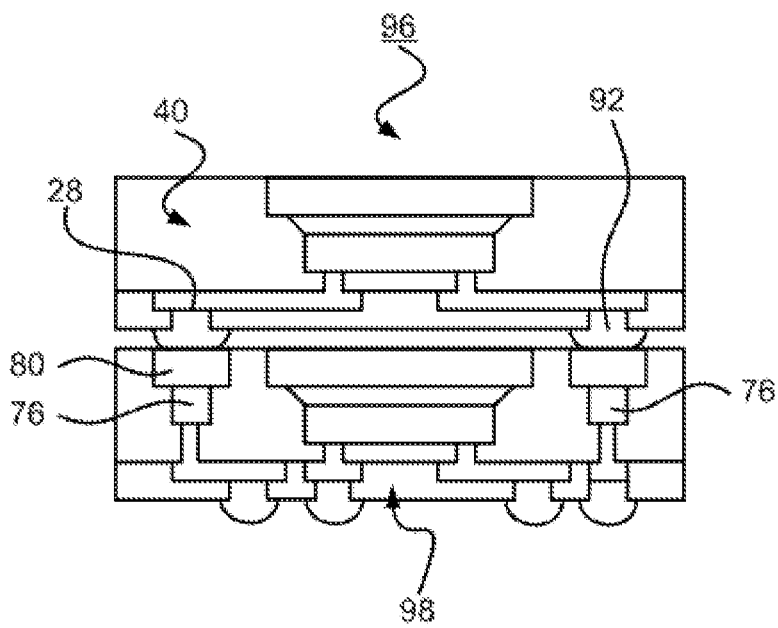
FIGS. 19 and 20 are enlarged cross-sectional views of stacked semiconductor packages in accordance with embodiments of the present invention.

Referring now to FIG. 19, a stacked semiconductor package 96 is shown. The stacked semiconductor package 96 includes a first semiconductor package 40 having a plurality of solder bumps 92 attached to the exposed surface of the first traces 28. The first semiconductor package 40 is stacked on a second semiconductor package 98 formed with a plurality of connectors 76 on a plurality of pads 80. The solder bumps 92 are electrically coupled to the pads 80 of the second semiconductor package 98.

The solder bumps 92 may be formed of any conductive bonding material such as, for example, a tin-based solder.

Figure 20:
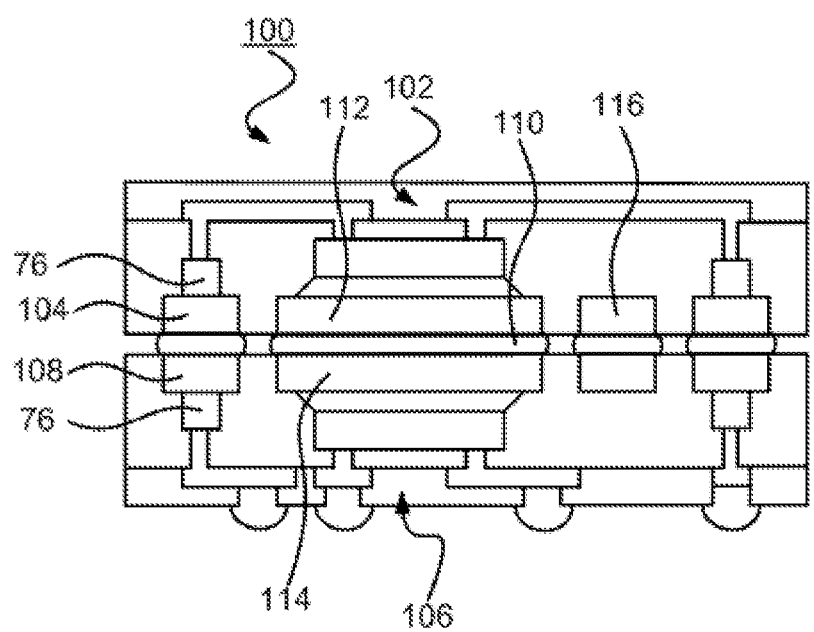

Referring now to FIG. 20, another stacked semiconductor package 100 is shown. The stacked semiconductor package 100 includes a first semiconductor package 102 formed with a plurality of connectors 76 on a plurality of first pads 104. The first semiconductor package 102 is stacked on a second semiconductor package 106 formed with a plurality of connectors 76 on a plurality of second pads 108. A solder material 110 electrically couples a first die pad 112 of the first semiconductor package 102 to a second die pad 114 of the second semiconductor package 106 and the first pads 104 of the first semiconductor package 102 to the second pads 108 of the second semiconductor package 106.

In the embodiment shown, a dummy pad 116 is provided on each of the first semiconductor package 102 and the second semiconductor package 106 for attachment.

Another semiconductor packaging method will now be described below with reference to FIGS. 21 through 24.

Figure 21:
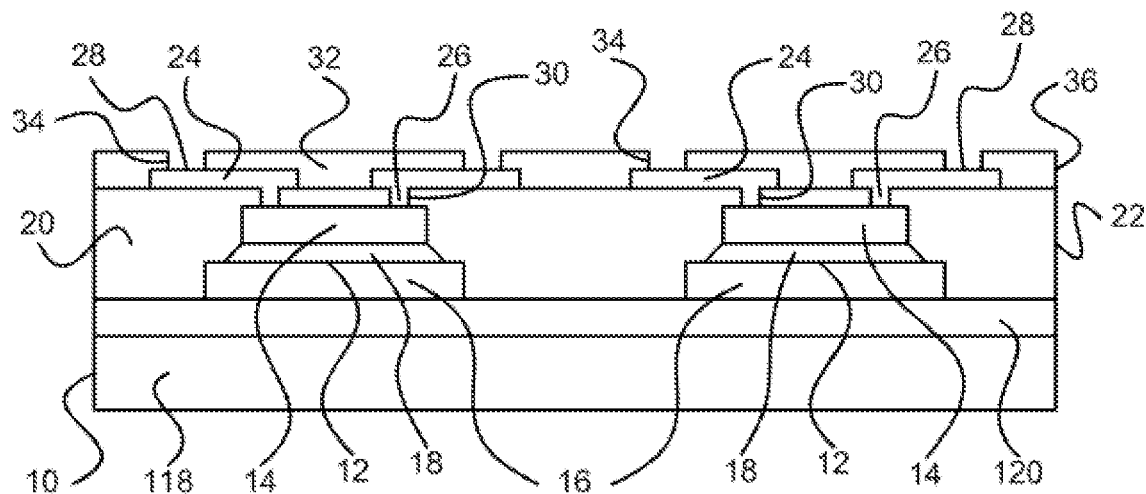
FIGS. 21 through 24 illustrate a semiconductor packaging method in accordance with yet another embodiment of the present invention.

Referring now to FIG. 21, the semiconductor packaging method of the present embodiment differs from the earlier embodiments in that the carrier 10 includes a first or support layer 118 and a second or working layer 120 provided on the first layer 118, the second layer 120 being formed of a first conductive material.

The first or support layer 118 may be made of steel and the second or working layer 120 may be made of copper. In one embodiment, the first or support layer 118 is a polymer resin sheet.

A plurality of die pads 16 are provided on the carrier 10. This may be by etching away portions of the second or working layer 120 outside a predetermined region without exposing the first or support layer 118. In an alternative embodiment, the die pads 16 may be formed by electroplating on the second or working layer 120. The locations of the die pads 16 may be pre-determined and patterned using photolithography. As can be seen from FIG. 21, a surface of the die pads 16 is elevated from a surface of the second or working layer 120.

A plurality of first semiconductor chips 14 are then attached to the die pads 16 with an active surface of the first semiconductor chips 14 facing away from the die pads 16. An adhesive 18 may be used to attach the first semiconductor chips 14 to the die pads 16. When in the form of a die-attach paste, the adhesive 18 may be pre-deposited on the die pads 16 before attachment of the first semiconductor chips 14. When in the form of a die-attach film, the adhesive 18 may be provided on a back surface of the first semiconductor chips 14.

The first semiconductor chips 14 are then encapsulated with a first encapsulant 20. A first dielectric layer 22 is thus disposed on the carrier 10 to encapsulate the first semiconductor chips 14 and the die pads 16.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. The locations of the first openings 30 correspond to the I/O pad locations on the active surface of the first semiconductor chips 14.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14. More particularly, the first vias 26 electrically connect I/O pads on the active surface of the first semiconductor chips 14 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

Figure 22:
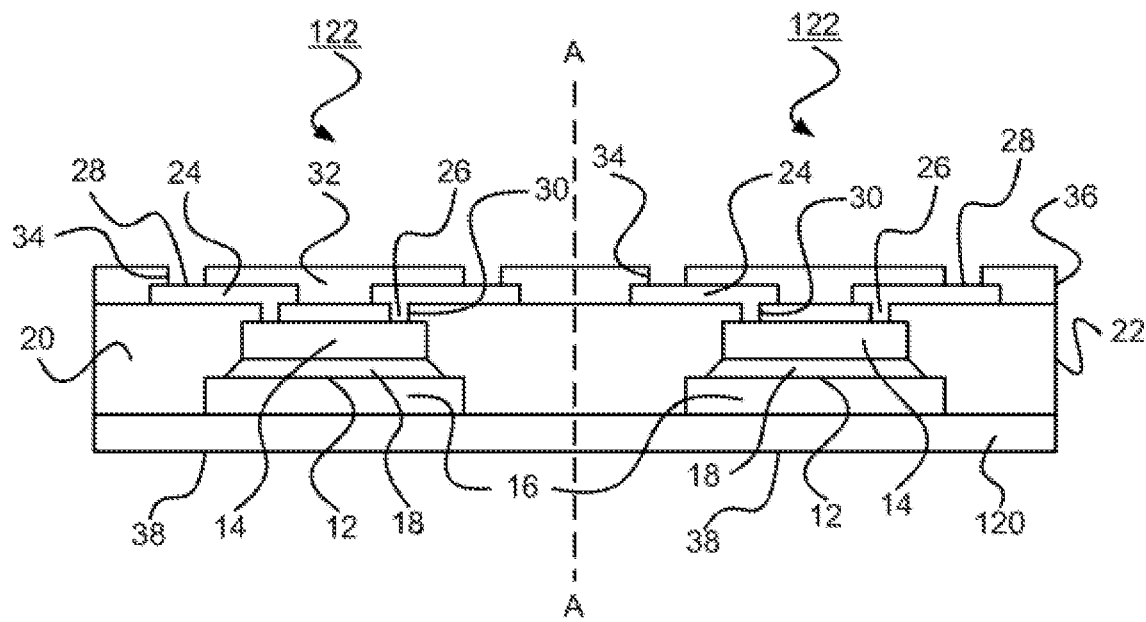

Referring now to FIG. 22, at least a portion of the carrier 10 is removed to provide a heat release area 38. In the present embodiment, the step of removing the at least a portion of the carrier 10 to provide the heat release area 38 includes removing at least a portion of the first layer 118 of the carrier 10. More particularly, the first or support layer 118 of the carrier 10 is removed to expose the second or working layer 120. Accordingly, the heat release area 38 in the embodiment shown is a surface of a conductive layer 120 to which the die pads 16 are attached. The exposed surface of the second or working layer 120 may be coated with an anti-corrosion or anti-oxidation layer such as, for example, nickel (Ni) or an organic solderability preservative (OSP).

After removal of the first layer 118 of the carrier 10 to expose the second or working layer 120, a plurality of semiconductor packages 122 thus formed may be separated along the vertical line A-A into individual package units by laser or mechanical dicing. The exposed second or working layer 120 forms a thermal plane for the finished package structure 122.

As can be seen from FIG. 22, each of the semiconductor packages 122 thus formed includes a first semiconductor chip 14, a first encapsulant 20 encapsulating the first semiconductor chip 14, a plurality of electrical connections 24 to the first semiconductor chip 14, and a heat release area 38 arranged to release heat generated by the first semiconductor chip 14. In the present embodiment, the heat release area 38 includes a surface of a conductive layer 120 to which the die pad 16 is attached, the first semiconductor chip 14 being attached to the die pad 16.

In an alternative embodiment, the semiconductor packages 122 may be completed with a plurality of first conductive studs 44 on the first traces 28 as described above in an earlier embodiment. In another embodiment, die pads 16 in FIGS. 21 and 22, and the semiconductor packages 122 may be omitted and the first semiconductor chip 14 is attached to the conductive layer 120.

Figure 23:
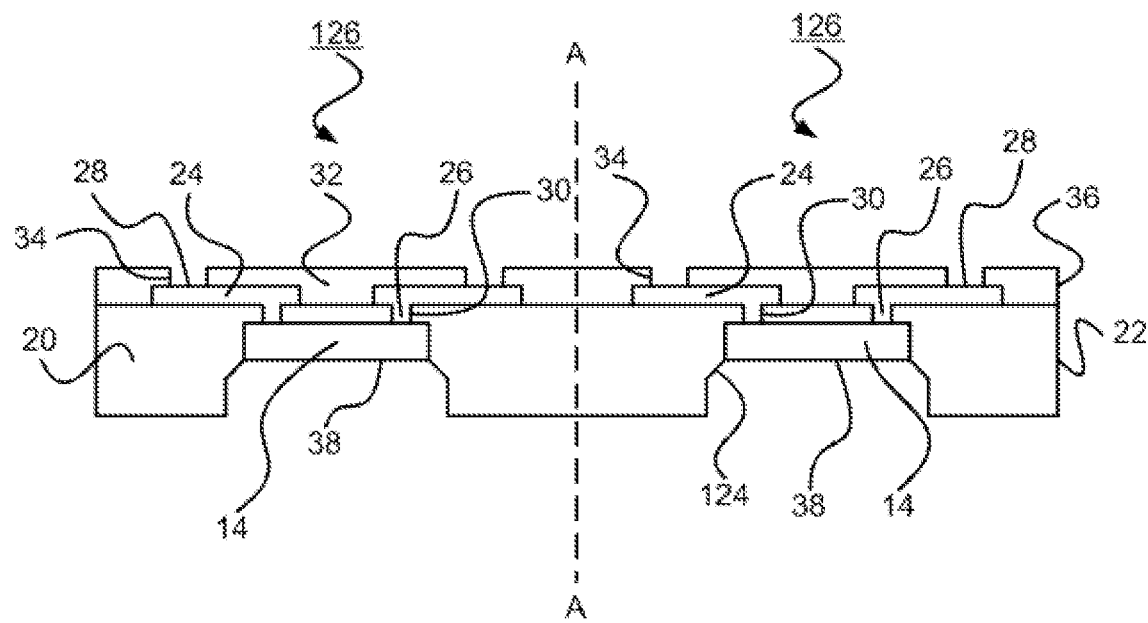

Referring now to FIG. 23, the thermal plane may be omitted in an alternative embodiment by removing the second or working layer 120 of the carrier 10 after removing the first or support layer 118 of the carrier 10 before unit separation. This exposes the surface of the die pads 16 and the first dielectric layer 22 and may be by chemical etching or physical separation.

Still further, the die pads 16 and the adhesive 18 may also be removed after removing the second or working layer 120 of the carrier 10 before unit separation. The die pads 16 may be removed by chemical etching and the adhesive may be removed by chemical dissolving or washing. This creates a cavity 124 in the package structure that exposes a back surface of the first semiconductor chips 14. In such an embodiment, the heat release area 38 comprises an exposed surface of the first semiconductor chips 14 after removal of the carrier 10 and the die pads 16.

As can be seen from FIG. 23, the back surface of the first semiconductor chips is lower than a surface of the first dielectric layer 22. The back surface of the first semiconductor chips 14 may only be partially exposed if the size (area) of the die pads 16 is smaller than the size (area) of the first semiconductor chips 14. The exposed back surface of the first semiconductor chips may be coated or sputtered with a protective layer such as, for example, titanium (Ti) or chromium (Cr).

Each of the semiconductor packages 126 thus formed includes a first semiconductor chip 14, a first encapsulant 20 encapsulating the first semiconductor chip 14, a plurality of electrical connections 24 to the first semiconductor chip 14, and a heat release area 38 arranged to release heat generated by the first semiconductor chip 14. In the present embodiment, the heat release area 38 includes a non-active surface of the first semiconductor chip 14.

Figure 24:
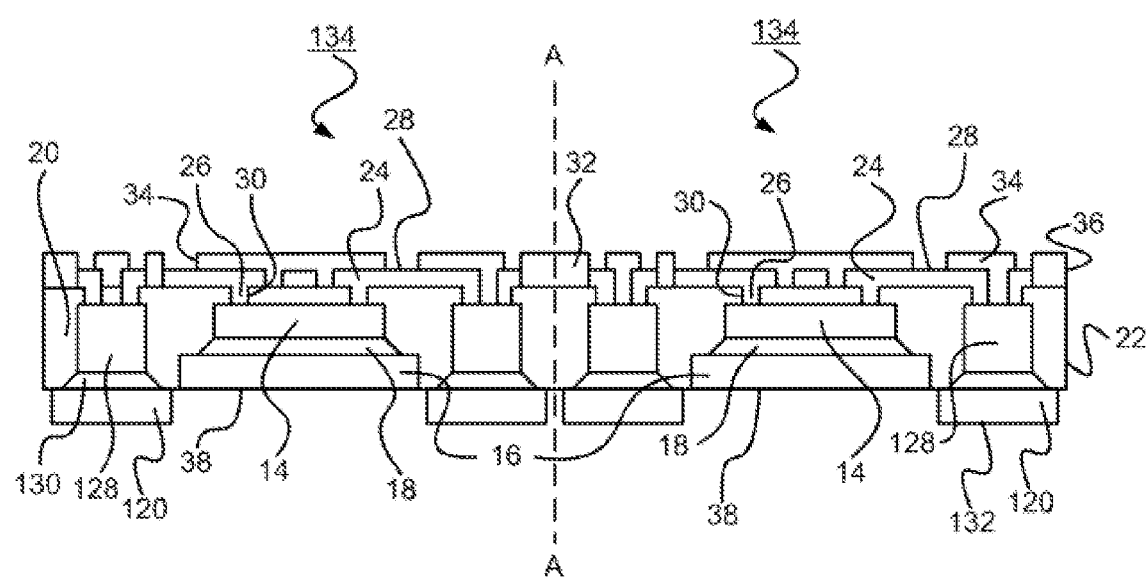

Referring now to FIG. 24, another semiconductor packaging method will now be described. The semiconductor packaging method of the present embodiment differs from the previous embodiment in that the semiconductor packaging method includes attaching a plurality of passive components 128 to the carrier 10 prior to the encapsulation step.

The passive components 128 may be disposed on a surface of the second or working layer 120 around a periphery of each of the die pads or platforms 16. The passive components 128 may be capacitors, resistors, diodes, integrated passive devices (IPD) or combinations thereof. A component adhesive 130 may be used to attach the passive components 128 to the surface of the second or working layer 120. The locations where the passive components 128 are to be mounted may be pre-marked using laser or other engraving means on the surface of the second or working layer 120. The component adhesive 130 may be pre-deposited on the second or working layer 120 (die-attach paste) or on the back surface of the passive components 128 (die-attach film) before attachment.

The first semiconductor chips 14 are attached to the die pads or platforms 16 with an active surface of the first semiconductor chips 14 facing away from the die pads or platforms 16. An adhesive 18 may be used to attach the first semiconductor chips 14 to the die pads 16. The die pads or platforms 16 may be used to compensate for the difference in thickness between the first semiconductor chips 14 and the passive components 128, especially in the case of thin chips. The thickness of the die pads or platforms 16 may be pre-determined and formed such that the active surface of the first semiconductor chips 14 is substantially level or higher than a surface of the passive components 128.

The first semiconductor chips 14 and the passive components 128 are then encapsulated with a first encapsulant 20. A first dielectric layer 22 is thus disposed on the carrier 10 to encapsulate the first semiconductor chips 14, the die pads 16 and the passive components 128.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose electrodes on an active surface of the first semiconductor chips 14 and the passive components 128. This may be by laser drilling or photolithography. The locations of the first openings 30 correspond to the electrode locations on the active surface of the first semiconductor chips 14 and the passive components 128. The depth of the first openings 30 to both the active surface of the first semiconductor chips 14 and the passive components 128 may be substantially equal as a result of using the die pads or platforms 16 to compensate for the difference in thickness between the first semiconductor chips 14 and the passive components 128.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14. The first traces 28 are also electrically connected to the passive components 128. The first vias 26 electrically connect the electrodes on the active surface of the first semiconductor chips 14 and the passive components 128 to the first traces 28.

At least a portion of the carrier 10 is then removed to provide a heat release area 38. In the present embodiment, the step of removing the at least a portion of the carrier 10 to provide the heat release area 38 includes removing at least a portion of the first layer 118 of the carrier 10. More particularly, the first or support layer 118 of the carrier 10 is removed to expose the second or working layer 120.

In the embodiment shown, a portion of the second layer 120 of the carrier 10 is also removed to form a plurality of component pads 132 after removing the first layer 118 of the carrier 10. More particularly, the second or working layer 120 may be patterned by removing portions of the second or working layer 120 of the carrier 10 after removing the first or support layer 118 of the carrier 10 before unit separation. This may be by photolithography and chemical etching and exposes a surface of the die pads or platforms 16 and the first dielectric layer 22. The remaining portions of the second or working layer 120 forms the component pads 130 corresponding to the locations of the passive components 128 such that the component adhesive 130 component pads 132 is covered and not exposed. The exposed surface of the die pads 16 and the remaining portions of the second or working layer 120 may be coated with an anti-corrosion or anti-oxidation layer such as, for example, nickel (Ni) or an organic solderability preservative (OSP). Each of the die pads 16 forms a thermal pad for the finished package structure.

After removal of the carrier 10 to expose the die pads 16 and to form the component pads 132, a plurality of semiconductor packages 134 thus formed may be separated along the vertical line A-A into individual package units by laser or mechanical dicing.

As can be seen from FIG. 24, each of the semiconductor packages 134 thus formed differs from the semiconductor packages of the previous embodiments in that each of the semiconductor packages 134 includes a plurality of passive components 128 encapsulated by the first encapsulant 20.

In an alternative embodiment, the semiconductor packages 134 may be completed with a plurality of first conductive studs 44 on the first traces 28 as described above in an earlier embodiment.

In yet another embodiment, the semiconductor packages 134 may be provided with a plurality of connectors 76 or a plurality of connectors 76 formed on a plurality of pads 80 as described above in earlier embodiments, instead of the passive components 128.

Another semiconductor packaging method will now be described below with reference to FIGS. 25 through 27.

Figure 25:
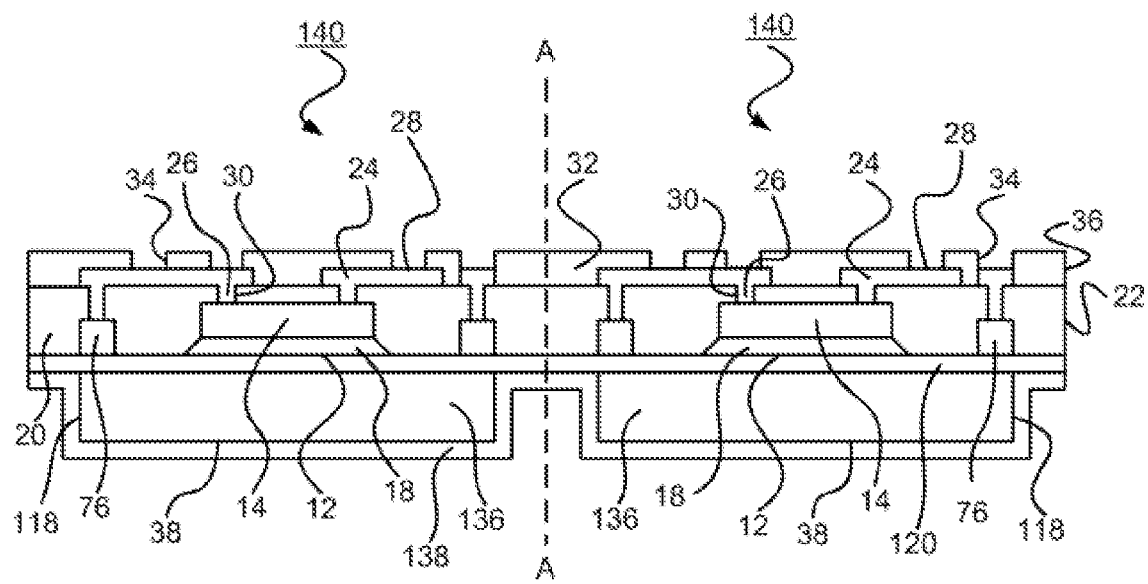
FIGS. 25 through 27 illustrate a semiconductor packaging method in accordance with still another embodiment of the present invention.

Referring now to FIG. 25, the semiconductor packaging method of the present embodiment differs from the earlier embodiments in that the first semiconductor chips 14 are attached to the semiconductor chip receiving areas 12 defined on the second or working layer 120 of the carrier 10 with an active surface of the first semiconductor chips 14 facing away from the semiconductor chip receiving areas 12. An adhesive 18 may be used to attach the first semiconductor chips 14 to the semiconductor chip receiving areas 12. In the embodiment shown, a plurality of connectors or columns 76 is also provided on the second or working layer 120 of the carrier 10.

The first semiconductor chips 14 and the connectors 76 are encapsulated with a first encapsulant 20. A first dielectric layer 22 is thus disposed on the carrier 10 to encapsulate the first semiconductor chips 14 and the connectors 76. The first dielectric layer 22 may be formed using a thermosetting polymer material, such as epoxy-based or phenol-based, in the form of a film sheet or paste. In another embodiment, the material may come in the form of a pellet or powder. Typically, the material may further comprises fillers such as silica. Preferably the first dielectric layer 22 is formed of an Ajinomoto buildup film (ABF) or an epoxy compound.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14 and a surface of the connectors 76. The locations of the first openings 30 correspond to the I/O pad locations on the active surface of the first semiconductor chips 14 and the locations of the connectors 76 on the carrier 10.

A plurality of first vias 26 extending though the first encapsulant 20 to the first semiconductor chips 14 and the connectors 76 and a plurality of first traces 28 on a surface of the first encapsulant 20 are then formed. The first traces 28 are electrically connected by the first vias 26 to the first semiconductor chips 14.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is removed to provide a heat release area 38. In the present embodiment, the step of removing the at least a portion of the carrier 10 to provide the heat release area 38 includes removing at least a portion of the first layer 118 of the carrier 10. More particularly, portions of the first or support layer 118 of the carrier 10 are selectively removed and the remaining portions of the first or support layer 118 provide a plurality of heat sinks or thermal blocks 136 on the second or working layer 120 of the carrier 10. In this manner, a plurality of heat sinks 136 is formed from removal of a portion of the first layer 118 of the carrier 10. Advantageously, the heat sinks 136 increase the surface area to the surrounding for better heat dissipation. The selective removal of the first or support layer 118 may be by photolithography and chemical etching. The exposed surface of the second or working layer 120 of the carrier 10 may be coated with an anti-corrosion or anti-oxidation layer such as, for example, nickel (Ni) or an organic solderability preservative (OSP). In this embodiment, the second or working layer 120 forms a thermal plane for the finished package structure.

In the present embodiment, the connectors 76 embedded within the first dielectric layer 22 connect the top of the package unit to the base of the package unit, connecting the second or working layer 120 with the heat sinks or thermal blocks 136 to external pads of the package for external connections. The heat sinks 136 may also act as a ground shield and the first semiconductor chips 14 may be electrically connected to the heat sinks 136 via a path of the first traces 28, the first vias 26 and the connectors 76 for grounding purpose. In one embodiment, a plurality of vertical connectors 76 may be disposed in a peripheral arrangement and be connected to the heat sinks 136, serving as an electromagnetic shield for shielding the first semiconductor chips 14 from external electrical disturbances.

In the embodiment shown, a coating layer 138 is formed over an exposed portion of the second layer 120 of the carrier 10 and the heat sinks 136 after removing the at least a portion of the first layer 118 of the carrier 10. The coating layer 138 may be formed on the exposed surface of the second or working layer 120 and the heat sinks or thermal blocks 136 by electrolytic plating using the second or working layer 120 as a conductive plane for the whole panel. The coating layer 138 may be of a different material than the heat sinks or thermal blocks 136 to create a differential thermal conductivity for enhanced thermal dissipation. The heat sinks or thermal blocks 136 may be made of steel and the coating layer 138 may be made of copper or nickel. The coating layer 138 may also be an anti-corrosion or anti-oxidation layer such as, for example, nickel (Ni) or an organic solderability preservative (OSP).

A plurality of semiconductor packages 140 thus formed may be separated along the vertical line A-A into individual package units by laser or mechanical dicing. Because singulation takes place along the regions of the exposed second or working layer 120 where a thickness of the carrier 10 has been significantly reduced after selectively removing portions of the first or support layer 118, the singulation process is facilitated. This translates, for example, into faster sawing times and reduced sawblade wear.

As can be seen from FIG. 25, an area of each of the heat sinks or thermal blocks 136 is smaller than an area of the corresponding semiconductor package 140. As such, a step is present around a periphery of each of the semiconductor packages 140 such that a thickness of the semiconductor package 140 around the periphery is less than the thickness of the semiconductor package 140 at a central region. The area of each of the heat sinks or thermal blocks 136 may be larger than an area of the corresponding first semiconductor chip 14.

Each of the semiconductor packages 140 thus formed includes a first semiconductor chip 14, a first encapsulant 20 encapsulating the first semiconductor chip 14, a plurality of electrical connections 24 to the first semiconductor chip 14, and a heat release area 38 arranged to release heat generated by the first semiconductor chip 14. In the present embodiment, the heat release area 38 includes a surface area of a heat sink 136 attached to a first surface of a conductive layer 120, the first semiconductor chip 14 being attached to a second surface of the conductive layer 120. In the embodiment shown, the semiconductor package 140 includes a coating layer 138 over the heat release area 38.

In an alternative embodiment, the semiconductor packages 140 may be completed with a plurality of first conductive studs 44 on the first traces 28 as described above in an earlier embodiment.

In other embodiments, the semiconductor packages 140 may be formed without the connectors 76, with the connectors 76 formed on a plurality of pads 80, with a plurality of passive components 128 and/or with a plurality of die pads 16 as described above in earlier embodiments.

In an embodiment where a die pad 16 is provided on a first surface of the second or working layer 120 and the first semiconductor chip 14 is attached to the die pad 16, the heat release area 38 may include a surface area of a heat sink 136 attached to a second surface of the conductive layer 120, the die pad 16 being attached to the first surface of the conductive layer 120.

The thermal blocks 136 may be provided in different configurations. Examples of these will now be described below with reference to FIGS. 26 and 27.

Figure 26:
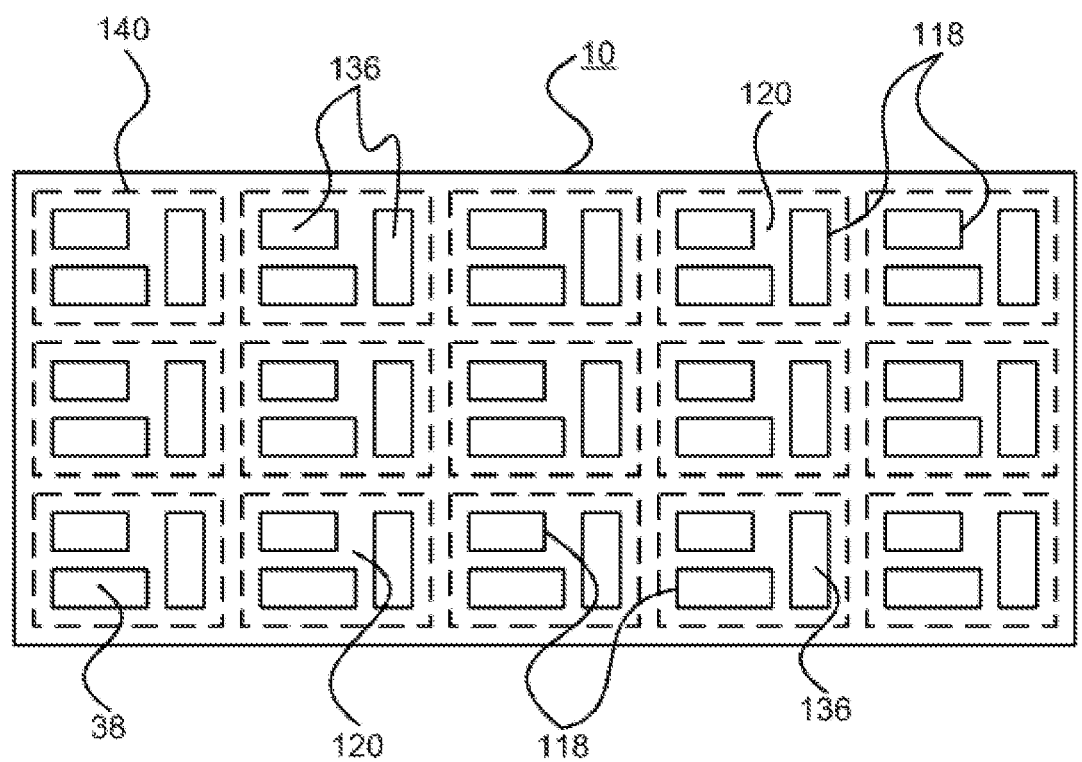

Referring now to FIG. 26, a bottom plan view of an array of heat sinks 136 formed from removal of a portion of the first layer 118 of the carrier 10 is shown. In the embodiment shown, the first or support layer 118 is formed into an array of thermal blocks on the second or working layer 120 of the carrier 10. Advantageously, the array of heat sinks 136 increases the surface area to the surrounding for increased heat dissipation.

In the embodiment shown, the heat release area 38 includes a surface area of an array of heat sinks 136 attached to a first surface of a conductive layer 120, the first semiconductor chip 14 being attached to a second surface of the conductive layer 120.

Figure 27:
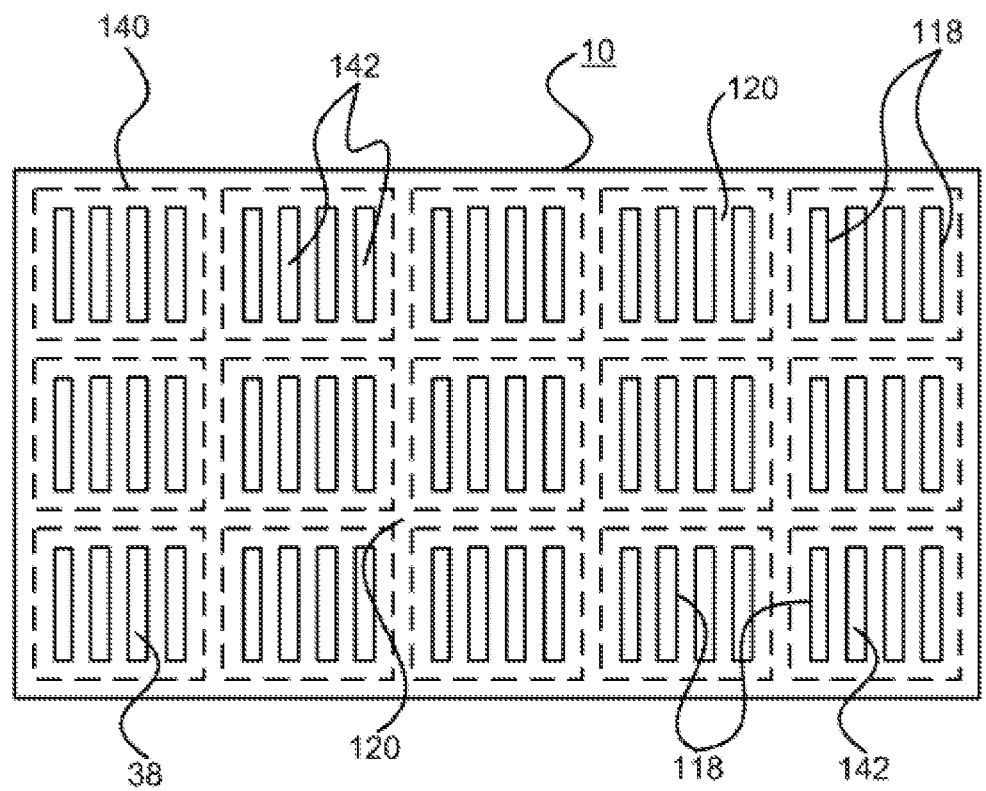

Referring now to FIG. 27, a bottom plan view of a plurality of fins 142 formed from removal of a portion of the first layer 118 of the carrier 10 is shown. In the embodiment shown, the first or support layer 118 is formed into an array of thermal fins or walls on the second or working layer 120 of the carrier 10. Advantageously, the array of fins 142 increases the surface area to the surrounding for increased heat dissipation.

In the present embodiment, the heat release area 38 includes a surface area of a plurality of fins 142 attached to a first surface of a conductive layer 120, the first semiconductor chip 14 being attached to a second surface of the conductive layer 120.

Yet another semiconductor packaging method will now be described below with reference to FIGS. 28 and 29.

Figure 28:
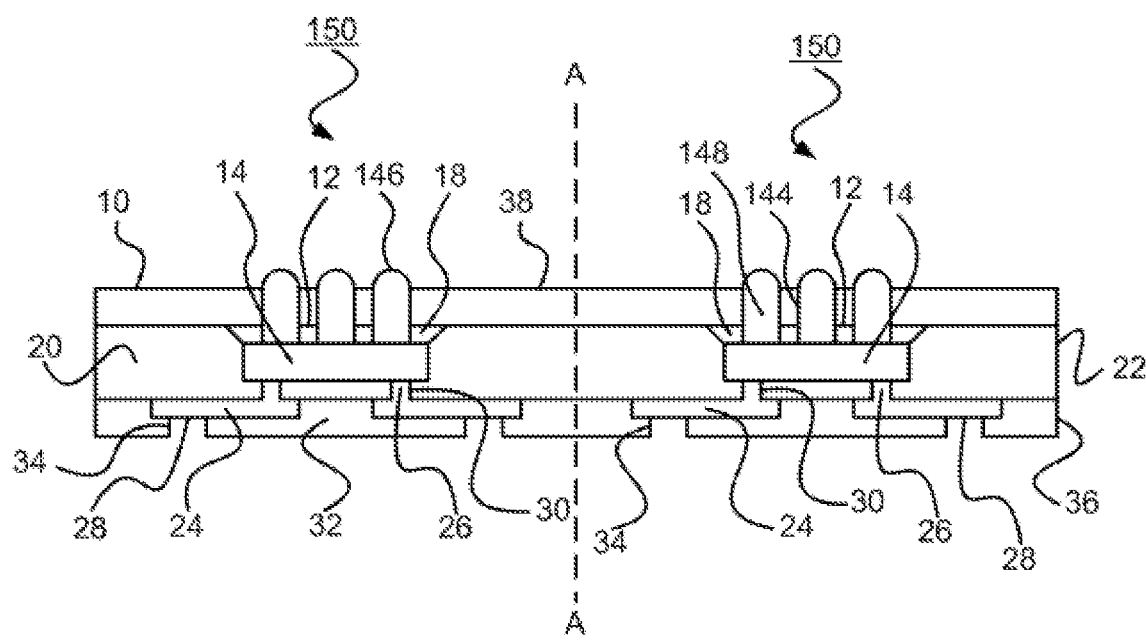
FIGS. 28 and 29 illustrate a semiconductor packaging method in accordance with yet another embodiment of the present invention.

Referring now to FIG. 28, the semiconductor packaging method of the present embodiment includes providing a carrier 10 having a plurality of semiconductor chip receiving areas 12. The carrier 10 of the present embodiment includes a first or support layer 118 and a second or working layer 120 provided on the first layer 118, the second layer 120 being formed of a first conductive material. The first or support layer 118 may be made of steel or aluminum and the second or working layer 120 may be made of copper.

A plurality of first semiconductor chips 14 is attached to the semiconductor chip receiving areas 12 defined on the second or working layer 120 of the carrier 10 with an active surface of the first semiconductor chips 14 facing away from the semiconductor chip receiving areas 12. A back surface of the first semiconductor chips 14 opposite to the active surface of the first semiconductor chips 14 may be provided with a barrier layer. The barrier layer may be formed by sputtering using a titanium/chromium (Ti/Cr) layering or a chromium/copper (Cr/Cu) layering.

An adhesive 18 may be used to attach the first semiconductor chips 14 to the semiconductor chip receiving areas 12.

The first semiconductor chips 14 are encapsulated with a first encapsulant 20. A first dielectric layer 22 is thus disposed on the carrier 10 to encapsulate the first semiconductor chips 14.

After encapsulation, a plurality of electrical connections 24 is formed to the first semiconductor chips 14. In the present embodiment, forming the electrical connections 24 to the first semiconductor chips 14 includes forming a plurality of first vias 26 extending though the first encapsulant 20 to the first semiconductor chips 14, and forming a plurality of first traces 28 on a surface of the first encapsulant 20, the first traces 28 being electrically connected by the first vias 26 to the first semiconductor chips 14.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is removed to provide a heat release area 38. In the present embodiment, the first or support layer 118 of the carrier 10 is removed and at least one fourth opening 144 is formed through the second layer 120 of the carrier 10 to expose a surface of at least one of the first semiconductor chips 14 after removing the first layer 118 of the carrier 10. The first or support layer 118 of the carrier 10 may be removed by chemical etching and the fourth openings 144 may be formed by laser drilling. The locations of the openings correspond to a back surface of the first semiconductor chips 14. In the process of forming the fourth openings 144, a portion of the second or working layer 120 and a portion of the adhesive 18 are removed to expose a back surface of the first semiconductor chips 14.

In the embodiment shown, three (3) fourth openings 144 are formed through the second layer 120 of the carrier 10. Nevertheless, it should be appreciated by those of ordinary skill in the art that the present invention is not limited by the number of fourth openings 144 formed. In alternative embodiments, greater or fewer numbers of fourth openings 144 may be formed depending on the package requirements.

In the present embodiment, the at least one fourth opening 144 is filled with a solder material 146. In this manner, a plurality of third vias 148 is formed through the adhesive 18 and the second or working layer 120 of the carrier 10. The third vias 148 may be formed by depositing a metal seed layer on a surface of the second or working layer 120 and the sidewalls of the fourth openings 144 by electroless plating. The fourth openings 144 are then filled by solder electroplating, reflowing the solder paste and letting the solder material flow within the fourth openings 144. Any exposed portions of the seed layer are removed. After reflowing, the reflowed surface of the solder material 146 may be higher than a surface of the second or working layer 120 of the carrier 10.

A plurality of semiconductor packages 150 thus formed may be separated along the vertical line A-A into individual package units by laser or mechanical dicing.

As can be seen from FIG. 28, each of the semiconductor packages 150 includes a first semiconductor chip 14, a first encapsulant 20 encapsulating the first semiconductor chip 14, a plurality of electrical connections 24 to the first semiconductor chip 14, and a heat release area 38 arranged to release heat generated by the first semiconductor chip 14. In the present embodiment, the heat release area 38 includes a surface of a conductive layer 120 to which the first semiconductor chip 14 is attached.

In the embodiment shown, the semiconductor package 150 further includes at least one fourth opening 144 extending through the conductive layer 120 to the non-active surface of the first semiconductor chip 14. In the present embodiment, the at least one fourth opening 144 is filled with a solder material 146.

The third vias 148 may be formed within the die region of the semiconductor package 150 and function as channels for dissipating heat generated during chip operation. The third vias 148 may be formed at hot spots of the first semiconductor chip 14 where most heat is generated during semiconductor chip functioning.

Figure 29:
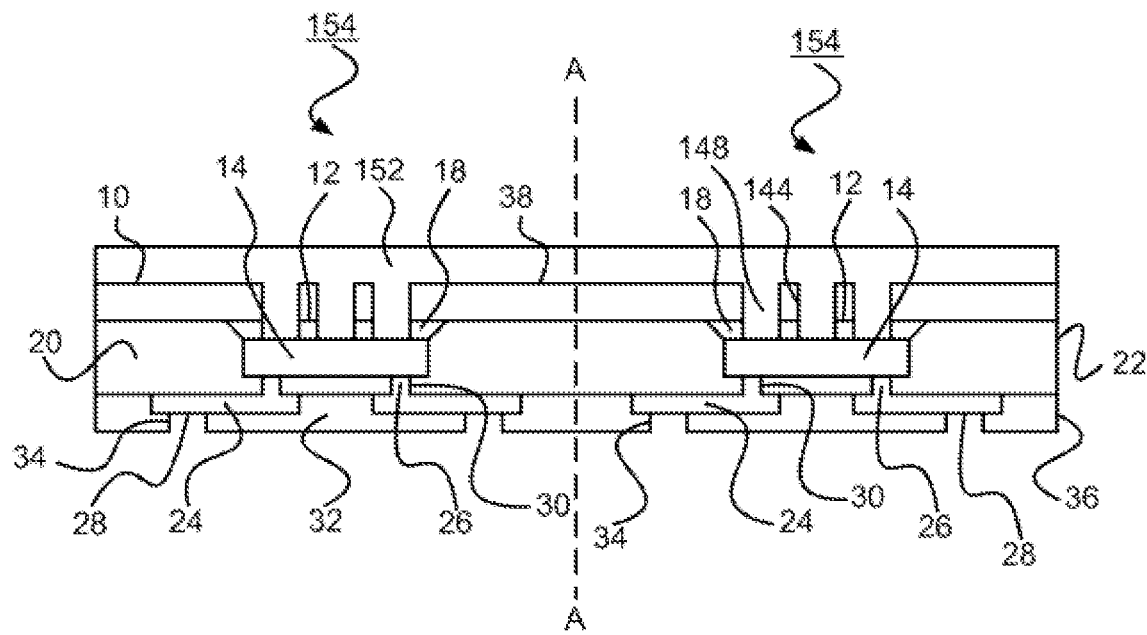

Referring now to FIG. 29, another semiconductor packaging method will now be described. The semiconductor packaging method of the present embodiment differs from the previous embodiment in that the at least one fourth opening 144 is filled with a second conductive material 152 to form the third vias 148 through the adhesive 18 and the second or working layer 120 of the carrier 10. The third vias 148 may be formed by a semi-additive electroplating process involving depositing a metal seed layer on the surface of the second or working layer 120 of the carrier 10 and the sidewalls of the fourth openings 144 by electroless plating, filling the fourth openings 144 with a conductive material such as, for example, copper, and removing any exposed portions of the seed layer. The electroplated surface of the third vias 148 may be lower than a surface of the second or working layer 120 of the carrier 10.

The semiconductor package 152 of FIG. 29 differs from that shown in FIG. 28 in that the at least one fourth opening 144 is filled with a conductive material 152. Additionally, in the embodiment shown, the semiconductor package 152 further includes a layer of the conductive material 152 on the conductive layer 120.

Figure 30:
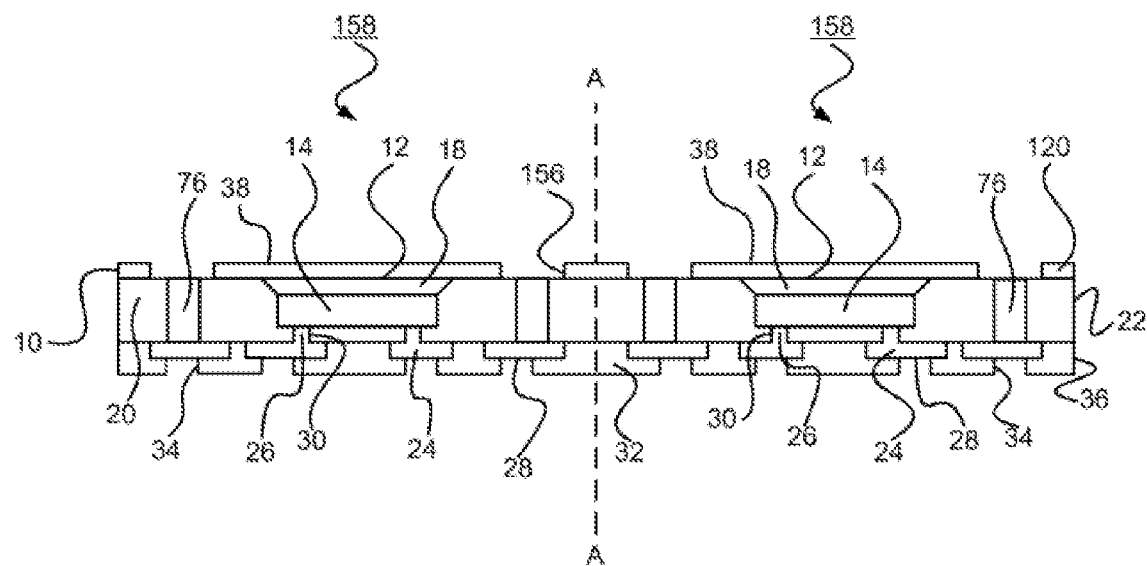
FIG. 30 illustrates a semiconductor packaging method in accordance with a further embodiment of the present invention.

Referring now to FIG. 30, another embodiment of the semiconductor packaging method will now be described. The semiconductor packaging method of the present embodiment includes providing a carrier 10 having a plurality of semiconductor chip receiving areas 12. The carrier 10 of the present embodiment includes a first or support layer 118 and a second or working layer 120 provided on the first layer 118, the second layer 120 being formed of a first conductive material. The first or support layer 118 may be made of steel or aluminum and the second or working layer 120 may be made of copper.

In the present embodiment, a plurality of connectors 76 is formed on the second or working layer 120. The connectors 76 may be formed by electroplating on the second or working layer 120. The locations of the connectors 76 may be pre-determined and patterned using photolithography. A surface of the connectors 76 is elevated from a surface of the second or working layer 120.

A plurality of first semiconductor chips 14 is attached to the semiconductor chip receiving areas 12 defined on the second or working layer 120 of the carrier 10 with an active surface of the first semiconductor chips 14 facing away from the semiconductor chip receiving areas 12.

An adhesive 18 may be used to attach the first semiconductor chips 14 to the semiconductor chip receiving areas 12.

The first semiconductor chips 14 and the connectors 76 are encapsulated with a first encapsulant 20. A first dielectric layer 22 is thus disposed on the carrier 10 to encapsulate the first semiconductor chips 14 and the connectors 76. The thickness of the first dielectric layer 22 may be thinned by grinding or polishing to expose a surface of the connectors 76.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. The locations of the first openings 30 correspond to electrode locations on the active surface of the first semiconductor chips 14.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The second dielectric layer 36 may be formed by screening printing using, for example, a soldermask and the second openings 34 may be formed in the second dielectric layer 36 by photolithography. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is removed to provide a heat release area 38. In the present embodiment, the first or support layer 118 of the carrier 10 is removed and the second or working layer 120 forms a thermal plane for the finished package structure. In the embodiment shown, a plurality of fifth openings 156 is formed in the second layer or thermal plane 120 to expose a surface of the connectors 76. This may be by photolithography or laser drilling.

A plurality of semiconductor packages 158 thus formed may be separated along the vertical line A-A into individual package units by laser or mechanical dicing.

Each of the semiconductor packages 158 includes a first semiconductor chip 14, a first encapsulant 20 encapsulating the first semiconductor chip 14 and a plurality of connectors 76, a plurality of electrical connections 24 to the first semiconductor chip 14, and a heat release area 38 arranged to release heat generated by the first semiconductor chip 14. In the present embodiment, the heat release area 38 includes a surface of a conductive layer 120 to which the first semiconductor chip 14 is attached.

In the embodiment shown, the semiconductor package 158 further includes a plurality of fifth openings 156 formed in the conductive layer 120, the fifth openings 156 exposing a surface of the connectors 76.

As can be seen from FIG. 30, the connectors 76 are formed in the first dielectric layer 22 and are outside the die region of the semiconductor package 158. The connectors 76 may be used to connect a variety of second semiconductor packages. In an alternative embodiment, the connectors 76 may additionally be formed in the first dielectric layer 22 at one or more corner portions of the semiconductor packages 158.

In yet another alternative embodiment, the connectors 76 may be formed to a height that is lower than the active surface of the first semiconductor chip 14. In such an embodiment, a plurality of third vias 148 may be formed to electrically connect the connectors 76 to the first traces 28.

Various stacked semiconductor packages that may be formed with the semiconductor package 158 described above will now be described below with reference to FIGS. 31 and 32.

Figure 31:
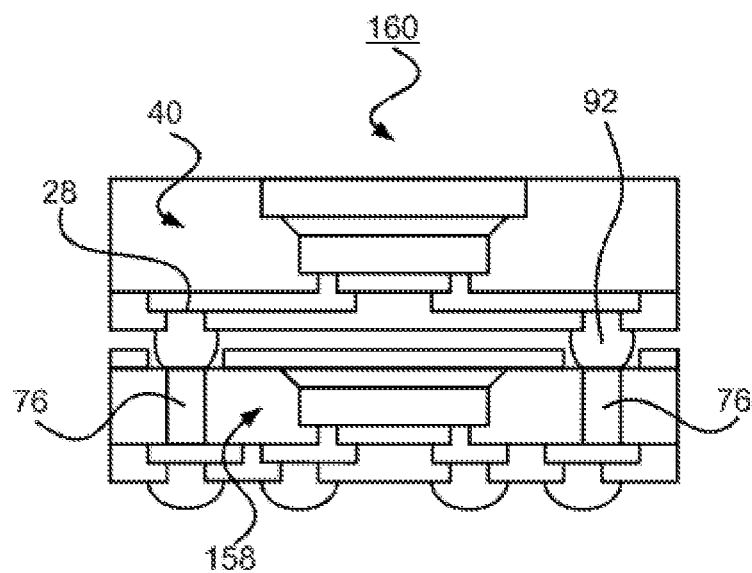
FIGS. 31 and 32 are enlarged cross-sectional views of stacked semiconductor packages in accordance with a further embodiment of the present invention.

Referring now to FIG. 31, a stacked semiconductor package 160 is shown. The stacked semiconductor package 160 includes a first semiconductor package 40 having a plurality of solder bumps 92 attached to the exposed surface of the first traces 28. The first semiconductor package 40 is stacked on a second semiconductor package 158 formed with a plurality of connectors 76. The solder bumps 92 are electrically coupled to the exposed surface of the connectors 76 of the second semiconductor package 158.

The solder bumps 92 may be formed of any conductive bonding material such as, for example, a tin-based solder.

Figure 32:
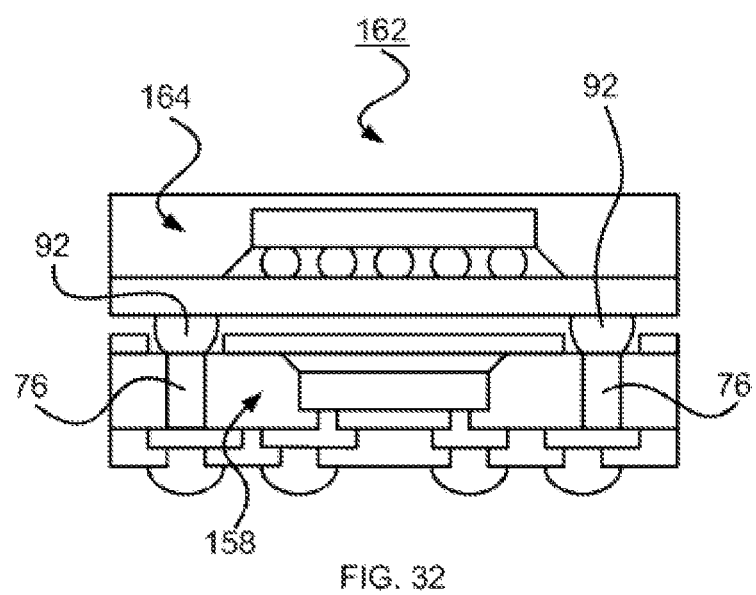

Referring now to FIG. 32, another stacked semiconductor package 162 is shown. The stacked semiconductor package 162 includes a first semiconductor package 158 formed with a plurality of connectors 76. A second semiconductor package 164 is stacked on the first semiconductor package 158. In the present embodiment, the second semiconductor package 164 is a wafer-level package having a plurality of solder bumps 92. The solder bumps 92 are electrically coupled to the exposed surface of the connectors 76 of the first semiconductor package 158.

In embodiment shown, the second semiconductor package 164 is a flip-chip chip scale package (CSP).

Another semiconductor packaging method will now be described below with reference to FIGS. 33 through 35.

Figure 33:
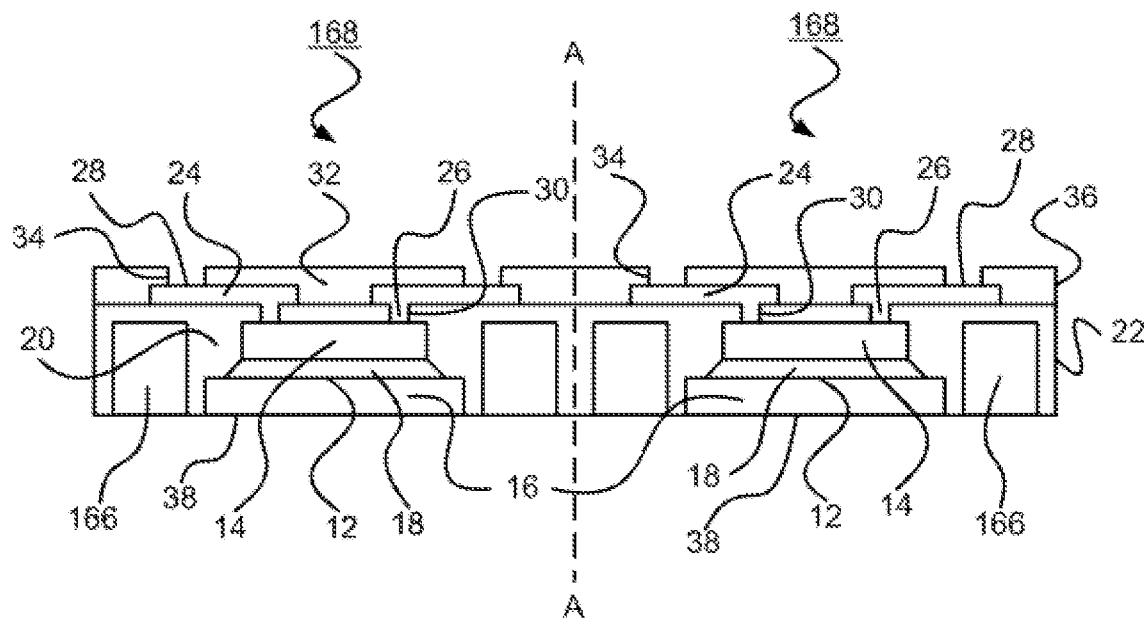
FIGS. 33 through 35 illustrate a semiconductor packaging method in accordance with another embodiment of the present invention.

Referring now to FIG. 33, the semiconductor packaging method of the present embodiment differs from the earlier embodiments in that at least one strengthening element 166 is formed on the carrier 10 prior to the encapsulation step.

Figure 34:
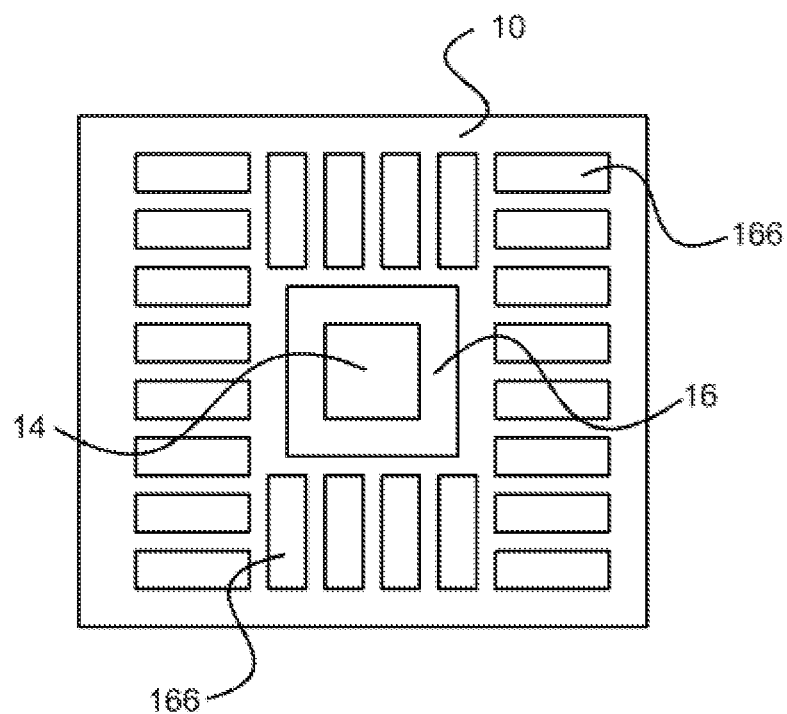

Referring now to FIG. 34, a top plan view of the carrier 10 having a plurality of strengthening elements 166 formed thereon is shown. In the embodiment shown, the strengthening elements 166 are disposed around the die pad 16. In the present embodiment, the strengthening elements 166 are provided in a grid like arrangement. The strengthening elements 166 may be formed by photolithography and electroplating. Advantageously, the provision of the strengthening elements 166 helps to strengthen the semiconductor package and reduce fragility of the semiconductor package.

In one embodiment, the strengthening elements 166 may be provided as strengthening fins around the first semiconductor chip 14. In such an embodiment, the electroplated strengthening fins may extend to a peripheral surface of the semiconductor package.

Figure 35:
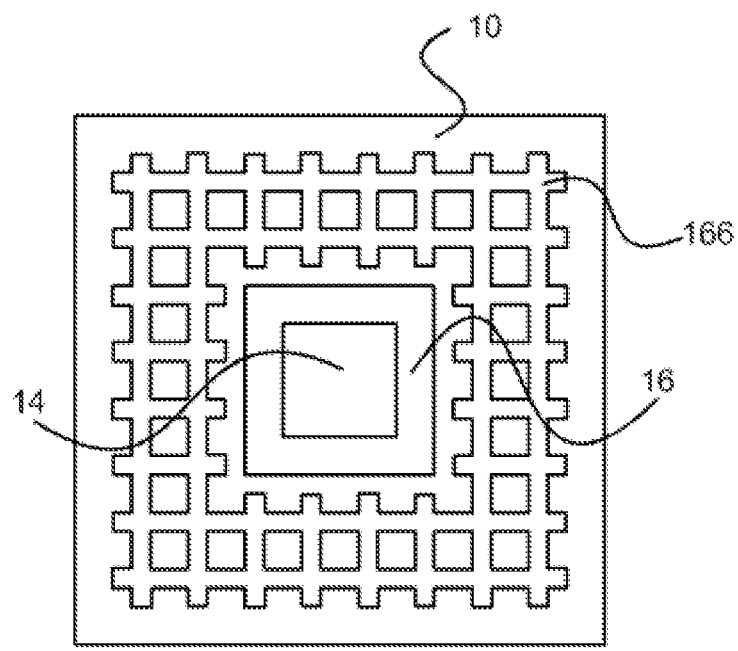

Referring now to FIG. 35, a top plan view of the carrier 10 having a different arrangement of the at least one strengthening element 166 is shown. In the present embodiment, the at least one strengthening element 166 is a pre-formed metal grid or a strengthening grid structure provided around the first semiconductor chip 14.

Referring again to FIG. 33, the first semiconductor chips 14 and the at least one strengthening element 166 are encapsulated with a first encapsulant 20. A first dielectric layer 22 is thus disposed on the carrier 10 to encapsulate the first semiconductor chips 14, the die pads 16 and the at least one strengthening element 166. The thickness of the first dielectric layer 22 may be thinned by grinding or polishing without exposing the first semiconductor chips 14 and the at least one strengthening element 166.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. The locations of the first openings 30 correspond to the I/O pad locations on the active surface of the first semiconductor chips 14.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14. More particularly, the first vias 26 electrically connect I/O pads on the active surface of the first semiconductor chips 14 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is then removed to provide a heat release area 38. In the present embodiment, the heat release area 38 is an exposed surface area of the die pads 16 after removal of the carrier 10. In the embodiment shown, a surface of the at least one strengthening element 166 is also exposed after removing the at least a portion of the carrier 10.

After removal of the carrier 10 to expose the die pads 16 and the surface of the at least one strengthening element 166, a plurality of semiconductor packages 168 thus formed may be separated along the vertical line A-A into individual package units by laser or mechanical dicing.

As can be seen from FIG. 33, each of the semiconductor packages 168 thus formed differs from the semiconductor packages of the previous embodiments in that each of the semiconductor packages 168 includes at least one strengthening element 166 encapsulated by the first encapsulant 20.

In an alternative embodiment, the semiconductor packages 168 may be formed with a carrier 10 having a first or support layer and a second or working layer provided on the first layer, the second layer being formed of a conductive material. In such an embodiment, the first semiconductor chips 14 and the at least one strengthening element 166 may be attached to the second or working layer.

Another semiconductor packaging method will now be described below with reference to FIGS. 36 and 37.

Figure 36:
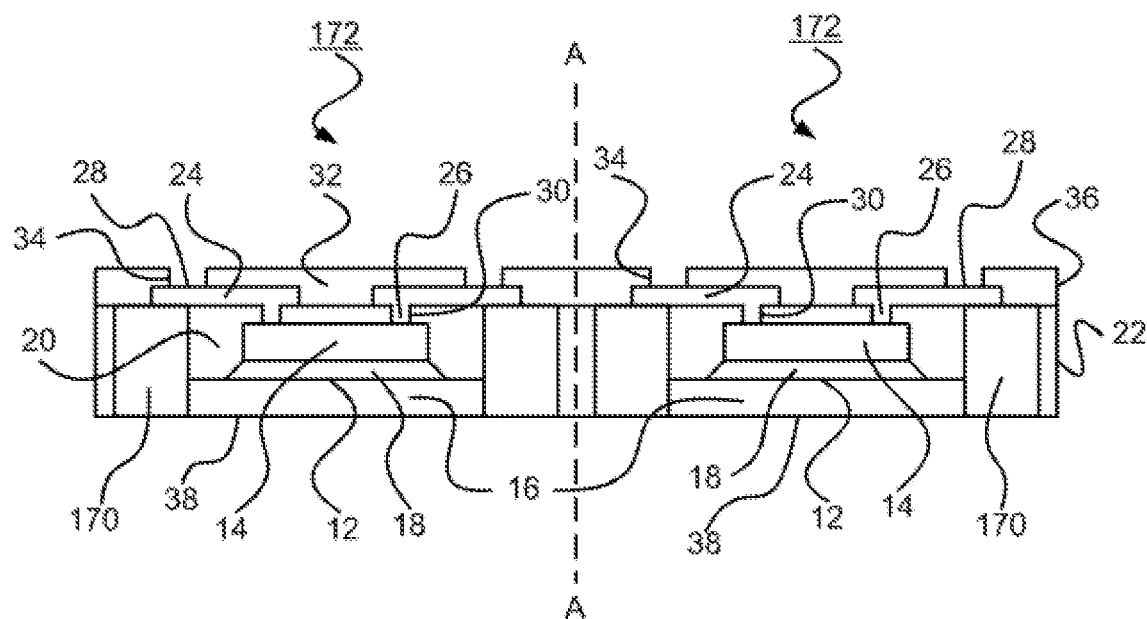
FIGS. 36 and 37 illustrate a semiconductor packaging method in accordance with yet another embodiment of the present invention.

Referring now to FIG. 36, the semiconductor packaging method of the present embodiment differs from the earlier embodiments in that an electromagnetic shielding structure 170 is formed on the carrier 10 prior to the encapsulation step.

Figure 37:
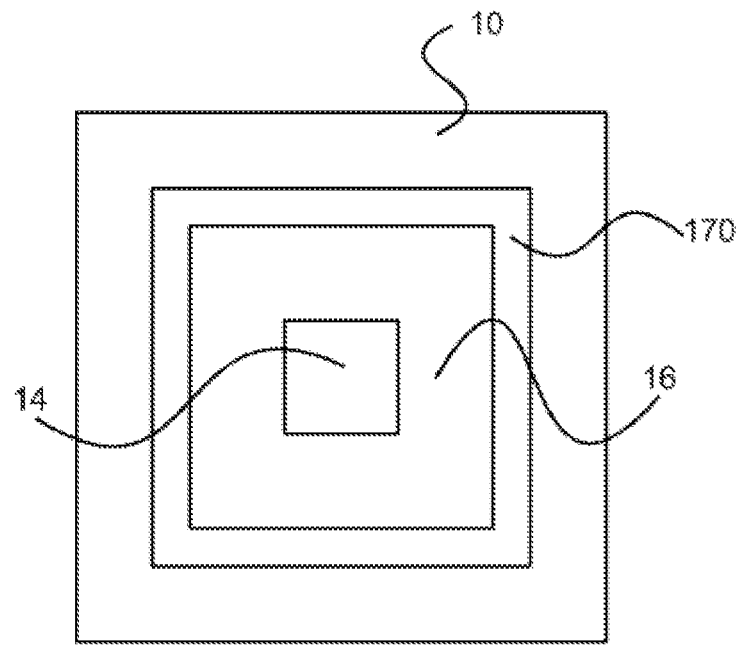

Referring now to FIG. 37, a top plan view of the carrier 10 having the electromagnetic shielding structure 170 formed thereon is shown. In the embodiment shown, the electromagnetic shielding structure 170 is disposed around the die pad 16. In the present embodiment, the electromagnetic shielding structure 170 is of a wall-like structure and may be formed by photolithography and electroplating. Advantageously, the provision of the electromagnetic shielding structure 170 helps contain electromagnetic radiation and reduce the amount of electromagnetic radiation that is emitted.

In alternative embodiments, the electromagnetic shielding structure 170 may be a circular wall structure extending around the first semiconductor chip 14 or a rectangular wall structure with curved corners extending around the first semiconductor chip 14.

Referring again to FIG. 36, the first semiconductor chips 14 and the electromagnetic shielding structure 170 are encapsulated with a first encapsulant 20. A first dielectric layer 22 is thus disposed on the carrier 10 to encapsulate the first semiconductor chips 14, the die pads 16 and the electromagnetic shielding structure 170. The thickness of the first dielectric layer 22 may be thinned by grinding or polishing without exposing the first semiconductor chips 14.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. The locations of the first openings 30 correspond to the I/O pad locations on the active surface of the first semiconductor chips 14.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14. More particularly, the first vias 26 electrically connect I/O pads on the active surface of the first semiconductor chips 14 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is then removed to provide a heat release area 38. In the present embodiment, the heat release area 38 is an exposed surface area of the die pads 16 after removal of the carrier 10. In the embodiment shown, a surface of the electromagnetic shielding structure 170 is also exposed after removing the at least a portion of the carrier 10.

After removal of the carrier 10 to expose the die pads 16 and the surface of the electromagnetic shielding structure 170, a plurality of semiconductor packages 172 thus formed may be separated along the vertical line A-A into individual package units by laser or mechanical dicing.

As can be seen from FIG. 36, each of the semiconductor packages 172 thus formed differs from the semiconductor packages of the previous embodiments in that each of the semiconductor packages 172 includes an electromagnetic shielding structure 170 encapsulated by the first encapsulant 20.

In an alternative embodiment, the semiconductor packages 172 may be formed with a carrier 10 having a first or support layer and a second or working layer provided on the first layer, the second layer being formed of a conductive material. In such an embodiment, the first semiconductor chips 14 and the electromagnetic shielding structure 170 may be attached to the second or working layer.

Another semiconductor packaging method will now be described below with reference to FIGS. 38 and 39.

Figure 38:
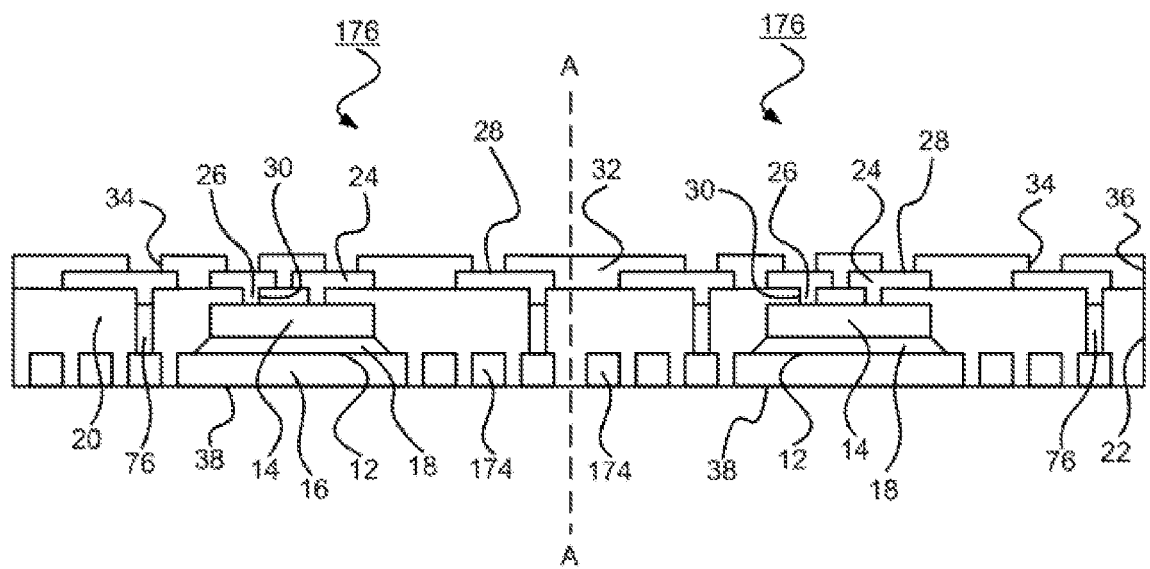
FIGS. 38 and 39 illustrate a semiconductor packaging method in accordance with still another embodiment of the present invention.

Referring now to FIG. 38, the semiconductor packaging method of the present embodiment differs from the earlier embodiments in that a pattern of embedded traces 174 is formed on the carrier 10 prior to the encapsulation step. The embedded traces 174 may be formed on the carrier 10 by photolithography or electroplating. In an alternative embodiment where the carrier 10 includes a first or support layer and a second or working layer, the embedded traces 174 may be formed by patterning the second or working layer by etching away portions of the second or working layer. The pattern of embedded traces 174 is exposed on the same surface with the heat release area 38 of the semiconductor package 176. The pattern of embedded traces 174 may be an inductor coil.

In the present embodiment, a plurality of connectors or columns 76 is formed on the embedded traces 174.

Figure 39:
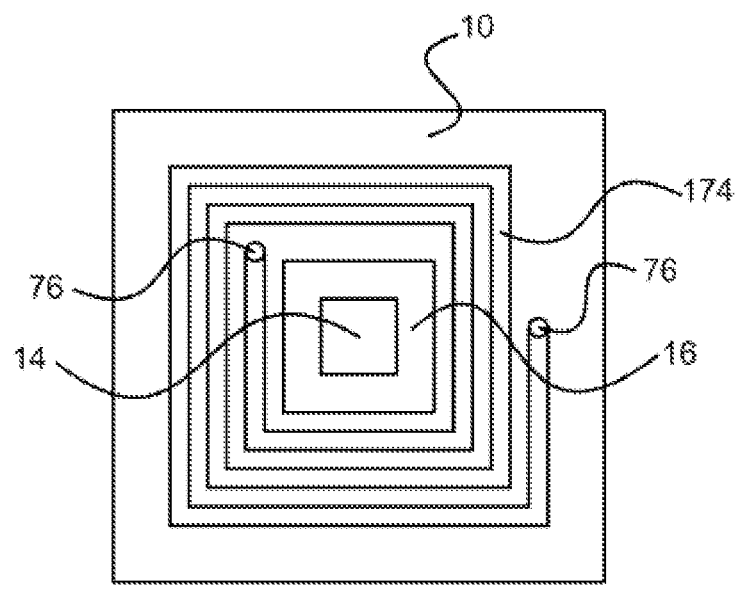

Referring now to FIG. 39, a top plan view of the carrier 10 having the embedded traces 174 formed thereon is shown. In the embodiment shown, the embedded traces 174 are disposed around the die pad 16.

In alternative embodiments, the embedded traces 174 may be disposed away from the die pad 16 or the first semiconductor chip 14 in the absence of a die pad. In one embodiment, the embedded traces 174 may be formed at a side of the die pad 16 or the first semiconductor chip 14.

Referring again to FIG. 38, the first semiconductor chips 14, the embedded traces 174 and the connectors 76 are encapsulated with a first encapsulant 20. A first dielectric layer 22 is thus disposed on the carrier 10 to encapsulate the first semiconductor chips 14, the die pads 16, the connectors 76 and the embedded traces 174. The thickness of the first dielectric layer 22 may be thinned by grinding or polishing without exposing the first semiconductor chips 14 and the connectors 76. In an alternative embodiment, the thickness of the first dielectric layer 22 may be thinned to expose a surface of the connectors 76.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14 and a surface of the connectors 76. The locations of the first openings 30 correspond to the I/O pad locations on the active surface of the first semiconductor chips 14 and the locations of the connectors 76.

A plurality of first vias 26 extending though the first encapsulant 20 to the first semiconductor chips 14 and the surface of the connectors 76 and a plurality of first traces 28 on a surface of the first encapsulant 20 are then formed. The first traces 28 are electrically connected by the first vias 26 to the first semiconductor chips 14. More particularly, the first vias 26 electrically connect I/O pads on the active surface of the first semiconductor chips 14 and the connectors 76 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is then removed to provide a heat release area 38. In the present embodiment, the heat release area 38 is an exposed surface area of the die pads 16 after removal of the carrier 10. In the embodiment shown, a surface of the embedded traces 174 is also exposed after removing the at least a portion of the carrier 10.

After removal of the carrier 10 to expose the die pads 16 and the surface of the embedded traces 174, a plurality of semiconductor packages 176 thus formed may be separated along the vertical line A-A into individual package units by laser or mechanical dicing.

As can be seen from FIG. 38, each of the semiconductor packages 176 thus formed differs from the semiconductor packages of the previous embodiments in that each of the semiconductor packages 176 includes an embedded traces 174 encapsulated by the first encapsulant 20.

Figure 40:
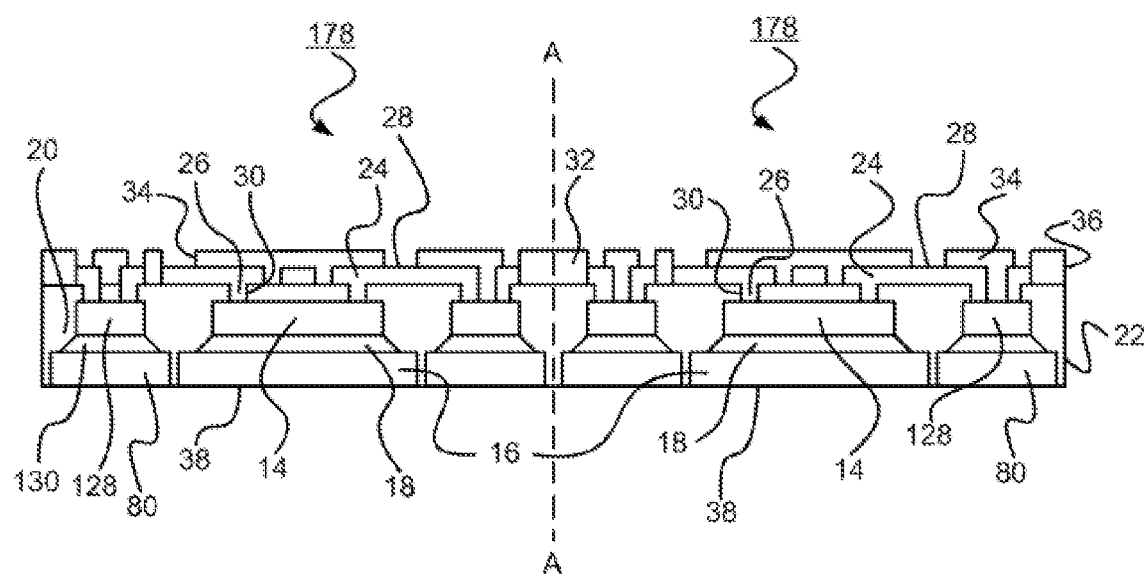
FIG. 40 illustrates a semiconductor packaging method in accordance with another embodiment of the present invention.

Referring now to FIG. 40, another semiconductor packaging method will now be described. The semiconductor packaging method of the present embodiment differs from the embodiment shown in FIG. 24 in that the semiconductor packaging method includes forming a plurality of pads 80 on the carrier 10 and attaching a plurality of passive components 128 to the pads 80 prior to the encapsulation step.

Each of the pads 80 of the present embodiment has a larger surface area than the corresponding passive component 128. The pads 80 and the passive components 128 may be disposed around the die pads 16. In one embodiment, the pads 80 may be formed on the carrier 10 by photolithography or electroplating. In an alternative embodiment where the carrier 10 includes a first or support layer and a second or working layer, the pads 80 may be formed by patterning the second or working layer by etching away portions of the second or working layer.

The passive components 128 may be capacitors, resistors, diodes, integrated passive devices (IPD) or combinations thereof. A component adhesive 130 may be used to attach the passive components 128 to the pads 80. The component adhesive 130 may be pre-deposited on the pads 80 (die-attach paste) or on the back surface of the passive components 128 (die-attach film) before attachment.

The first semiconductor chips 14 are attached to the die pads or platforms 16 with an active surface of the first semiconductor chips 14 facing away from the die pads or platforms 16. An adhesive 18 may be used to attach the first semiconductor chips 14 to the die pads 16. The die pads or platforms 16 may be used to compensate for the difference in thickness between the first semiconductor chips 14 and the passive components 128, especially in the case of thin chips. The thickness of the die pads or platforms 16 may be pre-determined and formed such that the active surface of the first semiconductor chips 14 is substantially level or higher than a surface of the passive components 128.

The first semiconductor chips 14 and the passive components 128 are then encapsulated with a first encapsulant 20. A first dielectric layer 22 is thus disposed on the carrier 10 to encapsulate the first semiconductor chips 14, the die pads 16 and the passive components 128.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose electrodes on an active surface of the first semiconductor chips 14 and the passive components 128. This may be by laser drilling or photolithography. The locations of the first openings 30 correspond to the electrode locations on the active surface of the first semiconductor chips 14 and the passive components 128. The depth of the first openings 30 to both the active surface of the first semiconductor chips 14 and the passive components 128 may be substantially equal as a result of using the die pads or platforms 16 to compensate for the difference in thickness between the first semiconductor chips 14 and the passive components 128.

A plurality of first vias 26 extending though the first encapsulant 20 to the first semiconductor chips 14 and a plurality of first traces 28 on a surface of the first encapsulant 20 are then formed. The first traces 28 are electrically connected by the first vias 26 to the first semiconductor chips 14. The first traces 28 are also electrically connected to the passive components 128. The first vias 26 electrically connect the electrodes on the active surface of the first semiconductor chips 14 and the passive components 128 to the first traces 28.

At least a portion of the carrier 10 is then removed to provide a heat release area 38. In the present embodiment, the heat release area 38 is an exposed surface area of the die pads 16 after removal of the carrier 10. In the embodiment shown, a surface of the pads 80 is also exposed after removing the at least a portion of the carrier 10.

The carrier 10 may be removed by chemical etching or physical separation to expose the die pads 16 and the surface of the pads 80. The exposed surface area of the die pads 16 and the surface of the pads 80 may be coated with an anti-corrosion or anti-oxidation layer such as, for example, nickel (Ni) or an organic solderability preservative (OSP).

After removal of the carrier 10 to expose the die pads 16 and the surface of the pads 80, a plurality of semiconductor packages 178 thus formed may be separated along the vertical line A-A into individual package units by laser or mechanical dicing.

As can be seen from FIG. 40, each of the semiconductor packages 178 thus formed differs from the semiconductor packages of the previous embodiments in that each of the semiconductor packages 134 includes a plurality of passive components 128 provided on a plurality of pads 80 and encapsulated by the first encapsulant 20.

In an alternative embodiment, the semiconductor packages 134 may be completed with a plurality of first conductive studs 44 on the first traces 28 as described above in an earlier embodiment.

Another semiconductor packaging method will now be described below with reference to FIGS. 41 and 42.

Figure 41:
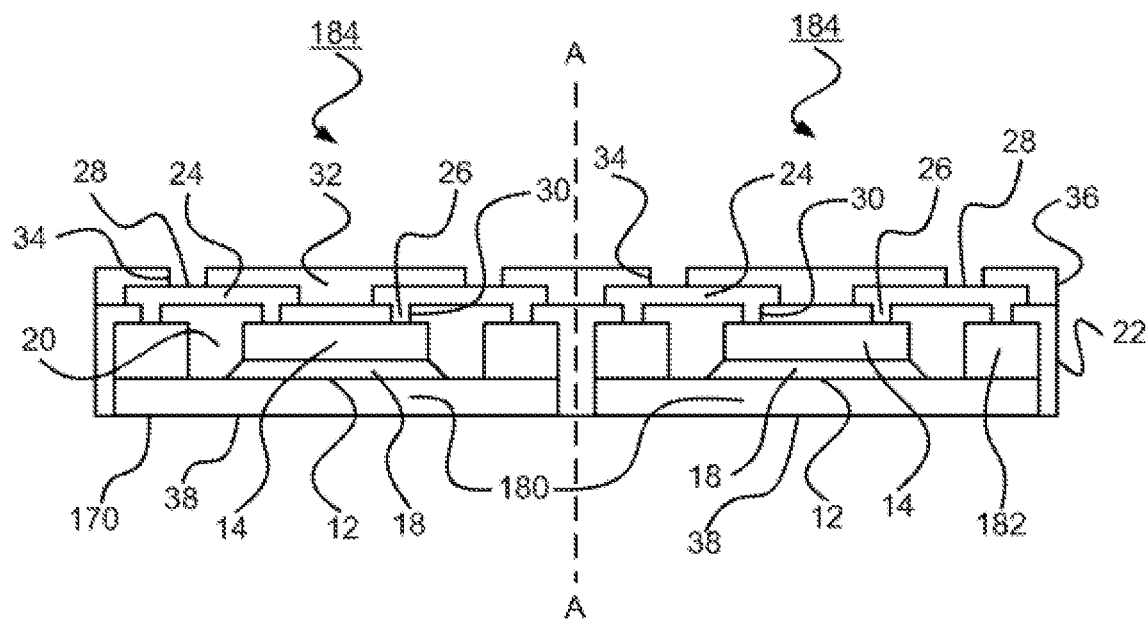
FIGS. 41 and 42 illustrate a semiconductor packaging method in accordance with yet another embodiment of the present invention.

Referring now to FIG. 41, the semiconductor packaging method of the present embodiment differs from the earlier embodiments in that an electromagnetic shielding structure 170 is formed on the carrier 10 prior to the encapsulation step. In this embodiment, the electromagnetic shielding structure 170 includes a platform portion 180 to which the first semiconductor chip 14 is attached and a wall portion 182 extending around a periphery of the first semiconductor chip 14. The electromagnetic shielding structure 170 may be formed by photolithography and electroplating. Advantageously, the provision of the electromagnetic shielding structure 170 helps contain electromagnetic radiation and reduce the amount of electromagnetic radiation that is emitted.

Figure 42:
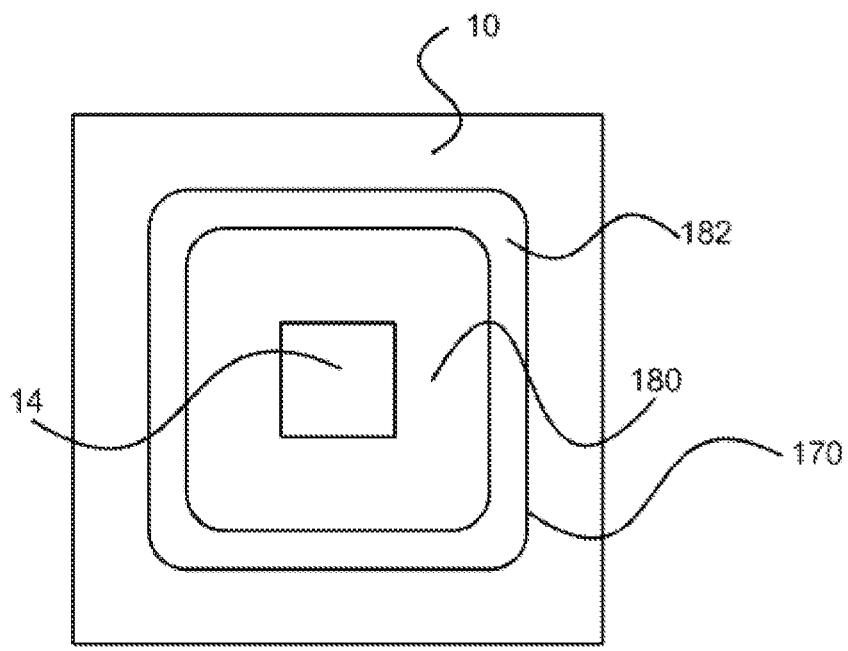

Referring now to FIG. 42, a top plan view of the carrier 10 having the electromagnetic shielding structure 170 formed thereon is shown. In the embodiment shown, the wall portion 182 of the electromagnetic shielding structure 170 is a rectangular or squarish wall structure with curved corners extending around the first semiconductor chip 14. In alternative embodiments, the wall portion 182 of the electromagnetic shielding structure 170 may be a circular wall structure extending around the first semiconductor chip 14.

Referring again to FIG. 41, the first semiconductor chips 14 and the electromagnetic shielding structure 170 are encapsulated with a first encapsulant 20. A first dielectric layer 22 is thus disposed on the carrier 10 to encapsulate the first semiconductor chips 14 and the electromagnetic shielding structure 170. The thickness of the first dielectric layer 22 may be thinned by grinding or polishing without exposing the first semiconductor chips 14.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. The locations of the first openings 30 correspond to the I/O pad locations on the active surface of the first semiconductor chips 14. In the embodiment shown, the first openings 30 are also formed to the wall portion 182 of the electromagnetic shielding structure 170.

A plurality of first vias 26 extending though the first encapsulant 20 to the first semiconductor chips 14 and the wall portion 182 of the electromagnetic shielding structure 170 and a plurality of first traces 28 on a surface of the first encapsulant 20 are then formed. The first traces 28 are electrically connected by the first vias 26 to the first semiconductor chips 14. More particularly, the first vias 26 electrically connect I/O pads on the active surface of the first semiconductor chips 14 to the first traces 28.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is then removed to provide a heat release area 38. In the present embodiment, the heat release area 38 is an exposed surface area of the platform portion 180 of the electromagnetic shielding structure 170 after removal of the carrier 10.

After removal of the carrier 10 to expose the platform portion 180 of the electromagnetic shielding structure 170, a plurality of semiconductor packages 184 thus formed may be separated along the vertical line A-A into individual package units by laser or mechanical dicing.

As can be seen from FIG. 41, each of the semiconductor packages 184 thus formed differs from the semiconductor packages of the previous embodiments in that each of the semiconductor packages 184 includes an electromagnetic shielding structure 170 encapsulated by the first encapsulant 20.

Figure 43:
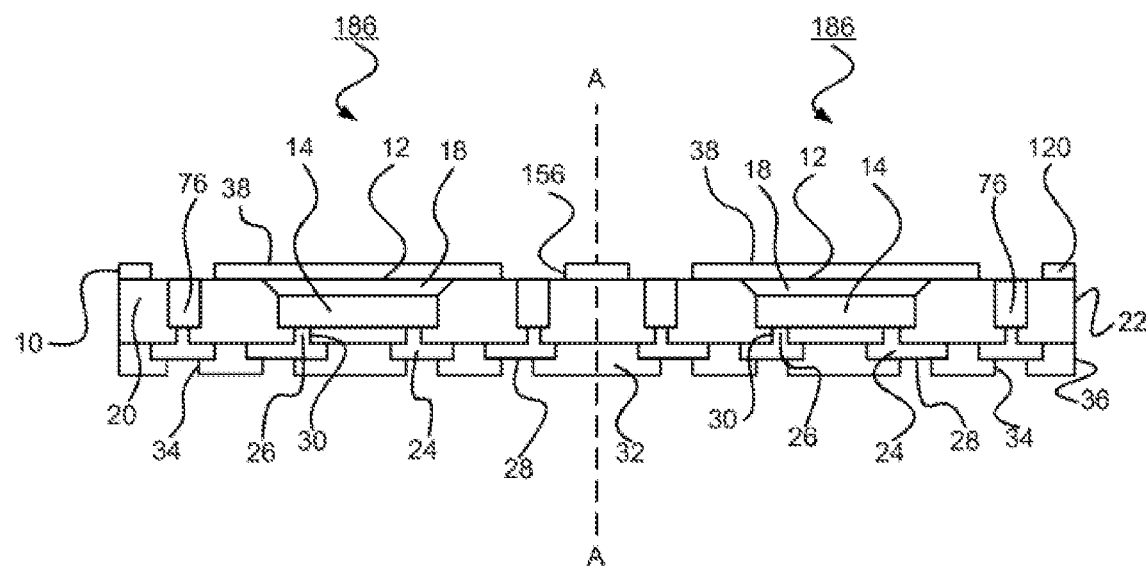
FIG. 43 illustrates a semiconductor packaging method in accordance with still another embodiment of the present invention.

Referring now to FIG. 43, another embodiment of the semiconductor packaging method will now be described. The semiconductor packaging method of the present embodiment includes providing a carrier 10 having a plurality of semiconductor chip receiving areas 12. The carrier 10 of the present embodiment includes a first or support layer 118 and a second or working layer 120 provided on the first layer 118, the second layer 120 being formed of a first conductive material. The first or support layer 118 may be made of steel or aluminum and the second or working layer 120 may be made of copper.

In the present embodiment, a plurality of connectors 76 is formed on the second or working layer 120. The connectors 76 may be formed by electroplating on the second or working layer 120. The locations of the connectors 76 may be pre-determined and patterned using photolithography. A surface of the connectors 76 is elevated from a surface of the second or working layer 120.

A plurality of first semiconductor chips 14 is attached to the semiconductor chip receiving areas 12 defined on the second or working layer 120 of the carrier 10 with an active surface of the first semiconductor chips 14 facing away from the semiconductor chip receiving areas 12.

An adhesive 18 may be used to attach the first semiconductor chips 14 to the semiconductor chip receiving areas 12.

The first semiconductor chips 14 and the connectors 76 are encapsulated with a first encapsulant 20. A first dielectric layer 22 is thus disposed on the carrier 10 to encapsulate the first semiconductor chips 14 and the connectors 76.

After encapsulation, a plurality of electrical connections 24 is formed to the first semiconductor chips 14. In the present embodiment, forming the electrical connections 24 to the first semiconductor chips 14 includes forming a plurality of first openings 30 through the first dielectric layer 22 to expose an active surface of the first semiconductor chips 14. The locations of the first openings 30 correspond to electrode locations on the active surface of the first semiconductor chips 14. In the embodiment shown, the first openings 30 are also formed to the connectors 76.

A plurality of first vias 26 extending though the first encapsulant 20 to the first semiconductor chips 14 and the connectors 76 and a plurality of first traces 28 on a surface of the first encapsulant 20 are then formed. The first traces 28 are electrically connected by the first vias 26 to the first semiconductor chips 14.

In the present embodiment, forming the electrical connections 24 to the first semiconductor chips 14 further includes encapsulating the first traces 28 with a second encapsulant 32, and forming a plurality of second openings 34 through the second encapsulant 32 to expose a surface of the first traces 28. A second dielectric layer 36 is thus formed on the first dielectric layer 22, the second dielectric layer 36 encapsulating the first traces 28. The second dielectric layer 36 may be formed by screening printing using, for example, a soldermask and the second openings 34 may be formed in the second dielectric layer 36 by photolithography. The exposed surface of the first traces 28 may be coated with a finishing layer, such as, for example, tin (Sn), a nickel/gold (Ni/Au) layering or an organic solderability preservative (OSP). The second openings 34 may subsequently be filled with a conductive material such as, for example, solder paste.

At least a portion of the carrier 10 is removed to provide a heat release area 38. In the present embodiment, the first or support layer 118 of the carrier 10 is removed and the second or working layer 120 forms a thermal plane for the finished package structure. In the embodiment shown, a plurality of fifth openings 156 is formed in the second layer or thermal plane 120 to expose a surface of the connectors 76. This may be by photolithography or laser drilling.

A plurality of semiconductor packages 186 thus formed may be separated along the vertical line A-A into individual package units by laser or mechanical dicing.

Each of the semiconductor packages 186 includes a first semiconductor chip 14, a first encapsulant 20 encapsulating the first semiconductor chip 14 and a plurality of connectors 76, a plurality of electrical connections 24 to the first semiconductor chip 14, and a heat release area 38 arranged to release heat generated by the first semiconductor chip 14. In the present embodiment, the heat release area 38 includes a surface of a conductive layer 120 to which the first semiconductor chip 14 is attached.

In the embodiment shown, the semiconductor package 186 further includes a plurality of fifth openings 156 formed in the conductive layer 120, the fifth openings 156 exposing a surface of the connectors 76.

As can be seen from FIG. 43, the connectors 76 are formed in the first dielectric layer 22 and are outside the die region of the semiconductor package 186. The connectors 76 may be used to connect a variety of second semiconductor packages. In an alternative embodiment, the connectors 76 may additionally be formed in the first dielectric layer 22 at one or more corner portions of the semiconductor packages 186.

Various stacked semiconductor packages that may be formed with the semiconductor package 186 described above will now be described below with reference to FIGS. 44 and 45.

Figure 44:
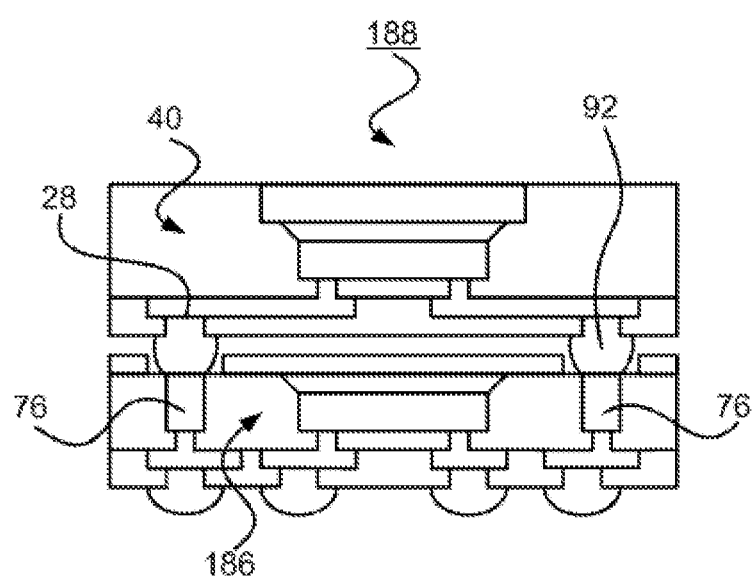
FIGS. 44 and 45 are enlarged cross-sectional views of stacked semiconductor packages in accordance with other embodiments of the present invention.

Referring now to FIG. 44, a stacked semiconductor package 188 is shown. The stacked semiconductor package 188 includes a first semiconductor package 40 having a plurality of solder bumps 92 attached to the exposed surface of the first traces 28. The first semiconductor package 40 is stacked on a second semiconductor package 186 formed with a plurality of connectors 76. The solder bumps 92 are electrically coupled to the exposed surface of the connectors 76 of the second semiconductor package 186.

The solder bumps 92 may be formed of any conductive bonding material such as, for example, a tin-based solder.

Figure 45:
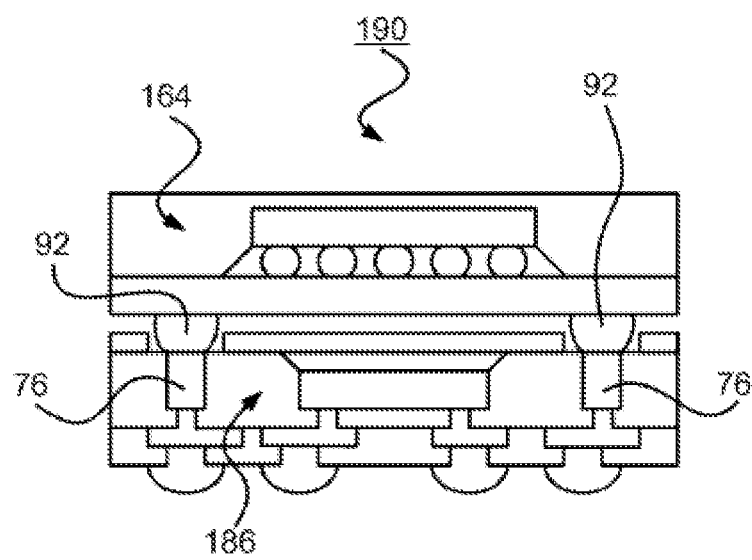

Referring now to FIG. 45, another stacked semiconductor package 190 is shown. The stacked semiconductor package 190 includes a first semiconductor package 186 formed with a plurality of connectors 76. A second semiconductor package 164 is stacked on the first semiconductor package 186. In the present embodiment, the second semiconductor package 164 is a wafer-level package having a plurality of solder bumps 92. The solder bumps 92 are electrically coupled to the exposed surface of the connectors 76 of the first semiconductor package 186.

In embodiment shown, the second semiconductor package 164 is a flip-chip chip scale package (CSP). As is evident from the foregoing discussion, the present invention provides an efficient semiconductor packaging method for forming semiconductor packages with improved thermal characteristics.

The description of the preferred embodiments of the present invention have been presented for purposes of illustration and description, but are not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiments disclosed, but covers modifications within the scope of the present invention as defined by the appended claims.

Further, unless the context clearly requires otherwise, throughout the description and the claims, the words "comprise", "comprising" and the like are to be construed in an inclusive as opposed to an exclusive or exhaustive sense; that is to say, in the sense of "including, but not limited to".

The invention claimed is:
1. A semiconductor package, comprising:
a first semiconductor chip having a plurality of circuit pads;
an electrically conductive layer provided over at least one of the circuit pads of the first semiconductor chip;
a first encapsulant encapsulating the first semiconductor chip;
a plurality of electrical connections to the first semiconductor chip, wherein the electrical connections to the first semiconductor chip comprises:
a plurality of vias extending through the first encapsulant to the first semiconductor chip, wherein a cross-sectional area of the vias is smaller than a surface area of the electrically conductive layer formed over the at least one of the circuit pads of the first semiconductor chip; and
a plurality of first traces on a surface of the first encapsulant, wherein the first traces are electrically connected by the vias to the first semiconductor chip;
a heat release area arranged to release heat generated by the first semiconductor chip, wherein the heat release area comprises one of:
a surface of a conductive layer to which a die pad is attached, wherein the first semiconductor chip is attached to the die pad;
a surface of a conductive layer to which the first semiconductor chip is attached;
a surface area of a heat sink attached to a conductive layer, wherein the first semiconductor chip is attached to the conductive layer;

a surface area of an array of heat sinks attached to a conductive layer, wherein the first semiconductor chip is attached to the conductive layer;

a surface area of a plurality of fins attached to a conductive layer, wherein the first semiconductor chip is attached to the conductive layer; and a surface area of a heat sink attached to a conductive layer to which a die pad is attached, wherein the first semiconductor chip is attached to the die pad;

a plurality of connectors encapsulated by the first encapsulant; and a plurality of openings formed in the conductive layer, the openings exposing a surface of the connectors.

2. The semiconductor package of claim 1, further comprising:

a second encapsulant encapsulating the first traces; and a plurality of openings extending through the second encapsulant to expose a surface of the first traces.

3. The semiconductor package of claim 1, further comprising:

a plurality of conductive studs on the first traces; and a second encapsulant encapsulating the first traces and the conductive studs, wherein a portion of the second encapsulant is removed, exposing a surface of the conductive studs.

4. The semiconductor package of claim 3, further comprising a plurality of second traces on a surface of the second encapsulant.

5. The semiconductor package of claim 1, wherein a surface area of the electrically conductive layer is greater than a surface area of the circuit pad over which the electrically conductive layer is formed.

6. The semiconductor package of claim 1, wherein the electrically conductive layer comprises a pad portion positioned above the circuit pad over which the electrically conductive layer is formed and a line portion extending away from the circuit pad.

7. The semiconductor package of claim 6, wherein the electrical connections to the first semiconductor chip are formed from the line portion of the electrically conductive layer.

8. The semiconductor package of claim 1, further comprising at least one of a plurality of pads, a plurality of passive components, at least one strengthening element, an electromagnetic shielding structure and an inductor coil encapsulated by the first encapsulant.

9. A stacked semiconductor package, comprising:

a first semiconductor package in accordance with claim 2;

a plurality of first solder bumps attached to the exposed surface of the first traces;

a second semiconductor package comprising:

a second semiconductor chip;

a third encapsulant encapsulating the second semiconductor chip;

a plurality of electrical connections to the second semiconductor chip;

a plurality of second solder bumps attached to the electrical connections to the second semiconductor chip, wherein the second solder bumps are electrically coupled to the exposed surface of the connectors of the first semiconductor package.

10. A stacked semiconductor package, comprising:

a first semiconductor package in accordance with claim 1;

a second semiconductor package, wherein the second semiconductor package is a wafer-level package having a plurality of solder bumps and wherein the solder bumps are electrically coupled to the exposed surface of the connectors of the first semiconductor package.

* * * * *